(12) United States Patent
Yun

(10) Patent No.: US 12,133,431 B2
(45) Date of Patent: Oct. 29, 2024

(54) DISPLAY APPARATUS

(71) Applicant: Samsung Display Co., Ltd., Yongin-si (KR)

(72) Inventor: Suyeon Yun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 409 days.

(21) Appl. No.: 17/531,821

(22) Filed: Nov. 22, 2021

(65) Prior Publication Data

US 2022/0208932 A1     Jun. 30, 2022

(30) Foreign Application Priority Data

Dec. 30, 2020  (KR) .................... 10-2020-0188077

(51) Int. Cl.
*H10K 59/131*    (2023.01)
*H10K 59/121*    (2023.01)

(52) U.S. Cl.
CPC ....... *H10K 59/131* (2023.02); *H10K 59/1213* (2023.02); *H10K 59/1216* (2023.02)

(58) Field of Classification Search
None
See application file for complete search history.

(56) References Cited

U.S. PATENT DOCUMENTS

| | | | |
|---|---|---|---|
| 9,449,995 B2 | 9/2016 | Im | |
| 10,153,354 B2 | 12/2018 | Xia | |
| 10,665,617 B2 | 5/2020 | Cho et al. | |
| 2020/0005708 A1* | 1/2020 | Hwang | H10K 59/1213 |
| 2020/0111855 A1 | 4/2020 | Bae et al. | |
| 2021/0408441 A1* | 12/2021 | Lee | H10K 50/824 |
| 2023/0031110 A1* | 2/2023 | Han | G09G 3/3233 |

FOREIGN PATENT DOCUMENTS

| | | |
|---|---|---|
| CN | 102629621 | 8/2012 |
| KR | 10-2020-0007937 | 1/2020 |
| KR | 10-2020-0039867 | 4/2020 |

\* cited by examiner

*Primary Examiner* — Evan G Clinton
(74) *Attorney, Agent, or Firm* — KILE PARK REED & HOUTTEMAN PLLC

(57) ABSTRACT

A display apparatus for a high-resolution display apparatus that configured to display a high-quality image includes an organic light-emitting diode, a driving transistor configured to control an amount of current flowing from a second node to the organic light-emitting diode according to a voltage applied to a first node, the second node being electrically connected to a power voltage line, and a first bottom metal layer disposed below the driving transistor and electrically connected to the driving transistor.

31 Claims, 30 Drawing Sheets

DISPLAY APPARATUS

CROSS-REFERENCE TO RELATED APPLICATION

This application claims priority from and the benefit of Korean Patent Application No. 10-2020-0188077, filed on Dec. 30, 2020, which is hereby incorporated by reference for all purposes as if fully set forth herein.

BACKGROUND

Field

Embodiments relate generally to a display apparatus, and more particularly, to a high-resolution display apparatus which may display a high-quality image.

Discussion of the Background

Generally, a display apparatus includes a plurality of pixels. Each pixel includes a display element and a pixel circuit configured to control the display element. The pixel circuit includes a thin-film transistor TFT and a storage capacitor.

To control whether a display element emits light and accurately control light emission degree, the number of transistors electrically connected to one display element has increased.

The above information disclosed in this Background section is only for understanding of the background of the inventive concepts, and, therefore, it may contain information that does not constitute prior art.

SUMMARY

However, in a display apparatus according to the related art, a high-quality image is not easy to display or a layered structure is complicated.

One or more embodiments include a high-resolution display apparatus which may display a high-quality image. However, such a technical problem is an example, and the disclosure is not limited thereto.

Additional features of the inventive concepts will be set forth in the description which follows, and in part will be apparent from the description, or may be learned by practice of the inventive concepts.

According to one or more embodiments, a display apparatus includes an organic light-emitting diode, a driving transistor configured to control an amount of current flowing from a second node to the organic light-emitting diode according to a voltage applied to a first node, the second node being electrically connected to a power voltage line, and a first bottom metal layer disposed below the driving transistor and electrically connected to the driving transistor.

The display apparatus may further include a first initialization transistor connected between the first node and a first initialization voltage line, wherein the first bottom metal layer may electrically connect the driving transistor to the first initialization transistor.

A driving semiconductor layer of the driving transistor and a first initialization semiconductor layer of the first initialization transistor may be disposed on different layers.

The first initialization semiconductor layer may be disposed over an insulating layer covering a driving gate electrode of the driving transistor.

The display apparatus may further include a connection electrode disposed over the first initialization semiconductor layer and connecting the first initialization semiconductor layer to the first bottom metal layer through contact holes.

When viewed from a direction perpendicular to the first bottom metal layer, the first bottom metal layer may overlap the first initialization semiconductor layer.

The driving semiconductor layer may include a silicon semiconductor, and the first initialization semiconductor layer may include an oxide semiconductor.

A driving gate electrode of the driving transistor may be electrically connected to the first bottom metal layer.

The driving gate electrode may be disposed over a driving semiconductor layer of the driving transistor, and connected to the first bottom metal layer through a contact hole defined in an insulating layer between the driving semiconductor layer and the driving gate electrode and in an insulating layer between the first bottom metal layer and the driving semiconductor layer.

The driving semiconductor layer may be bent to surround a portion of the contact hole.

The display apparatus may further include an emission control transistor connected between the driving transistor and the organic light-emitting diode and turned on when an emission control signal is supplied through an emission control line, a second initialization transistor connected between the emission control transistor and a second initialization voltage line, and a second bottom metal layer disposed below the emission control transistor and the second initialization transistor and electrically connecting the emission control transistor to the second initialization transistor.

An emission control semiconductor layer of the emission control transistor and a second initialization semiconductor layer of the second initialization transistor may be disposed on different layers.

The second initialization semiconductor layer may be disposed over an insulating layer covering an emission control gate electrode of the emission control transistor.

The display apparatus may further include a first connection electrode disposed over the second initialization semiconductor layer and electronically connecting the second initialization semiconductor layer to the second bottom metal layer through contact holes, and a second connection electrode disposed on a same layer as the first connection electrode and connecting the emission control semiconductor layer to the second bottom metal layer through contact holes.

The emission control semiconductor layer may include a silicon semiconductor, and the second initialization semiconductor layer may include an oxide semiconductor.

The second bottom metal layer may be disposed on a same layer as the first bottom metal layer.

The display apparatus may further include a storage capacitor connected between the first node and the power voltage line and including a first capacitor electrode and a second capacitor electrode, the first capacitor electrode being integrally formed as a single body with a driving gate electrode of the driving transistor, and the second capacitor electrode being disposed over the first capacitor electrode, an operation control transistor connected between the driving transistor and the power voltage line and turned on when an emission control signal is supplied through an emission control line, and a third bottom metal layer disposed below the operation control transistor and electrically connecting the operation control transistor to the second capacitor electrode.

The display apparatus may further include a connection electrode disposed on a same layer as the second capacitor electrode and connecting an operation control semiconductor layer of the operation control transistor to the third bottom metal layer, wherein the second capacitor electrode may be electrically connected to the third bottom metal layer.

According to one or more embodiments, a display apparatus includes a substrate, a first active layer including a driving semiconductor layer disposed over the substrate, a first gate layer including a driving gate electrode disposed over the driving semiconductor layer, an organic light-emitting diode in which brightness thereof is controlled by a current flowing through the driving semiconductor layer according to a voltage applied to the driving gate electrode, and a bottom metal layer disposed below the first active layer and including a first bottom metal layer connected to the driving gate electrode.

The first gate layer may further include a first source electrode or a first drain electrode contacting the first active layer.

The first source electrode or the first drain electrode may contact a first wiring of the bottom metal layer.

The display apparatus may further include a second active layer disposed over the first gate layer and including a first initialization semiconductor layer, a second gate layer disposed between the first gate layer and the second active layer and including a bottom initialization line having a portion that overlaps the first initialization semiconductor layer, and a third gate layer disposed over the second active layer and including a top initialization line having a portion that overlaps the first initialization semiconductor layer, wherein the first bottom metal layer may electrically connect the driving gate electrode to the first initialization semiconductor layer.

The display apparatus may further include a source-drain layer disposed over the third gate layer and including a connection electrode connecting the first initialization semiconductor layer to the first bottom metal layer through contact holes.

When viewed from a direction perpendicular to the substrate, the first bottom metal layer may overlap the first initialization semiconductor layer.

The first active layer may include a silicon semiconductor, and the second active layer may include an oxide semiconductor.

The first active layer may further include an emission control semiconductor layer, the second active layer may further include a second initialization semiconductor layer, and the bottom metal layer may further include a second bottom metal layer electrically connecting the emission control semiconductor layer to the second initialization semiconductor layer.

The third gate layer may further include a first connection electrode and a second connection electrode, the first connection electrode connecting the second initialization semiconductor layer to the second bottom metal layer through contact holes, and the second connection electrode connecting the emission control semiconductor layer to the second bottom metal layer through contact holes.

The second gate layer may further include a second source electrode or a second drain electrode contacting the second active layer.

The second source electrode or the second drain electrode may contact a second wiring of the bottom metal layer.

The third gate layer may further include a first source electrode or a first drain electrode contacting the first active layer, and a second source electrode or a second drain electrode contacting the second active layer.

The first source electrode or the first drain electrode may contact a first wiring of the bottom metal layer, and the second source electrode or the second drain electrode may contact a second wiring of the bottom metal layer.

The driving gate electrode may be connected to the first bottom metal layer through a contact hole defined in an insulating layer between the first active layer and the first gate layer and in an insulating layer between the first bottom metal layer and the first active layer.

The driving semiconductor layer may be bent to surround a portion of the contact hole.

The display apparatus may further include a second gate layer disposed over the first gate layer and including a second capacitor electrode that at least partially overlaps the driving gate electrode, wherein the first active layer may further include an operation control semiconductor layer, wherein the first gate layer may further include a bottom emission control line that overlaps the operation control semiconductor layer, and wherein the bottom metal layer may further include a third bottom metal layer electrically connecting the operation control semiconductor layer to the second capacitor electrode.

The second gate layer may further include a connection electrode connecting the operation control semiconductor layer to the third bottom metal layer, and the second capacitor electrode may be connected to the third bottom metal layer.

These and/or other aspects will become apparent and more readily appreciated from the following description of the embodiments, the accompanying drawings, and claims.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
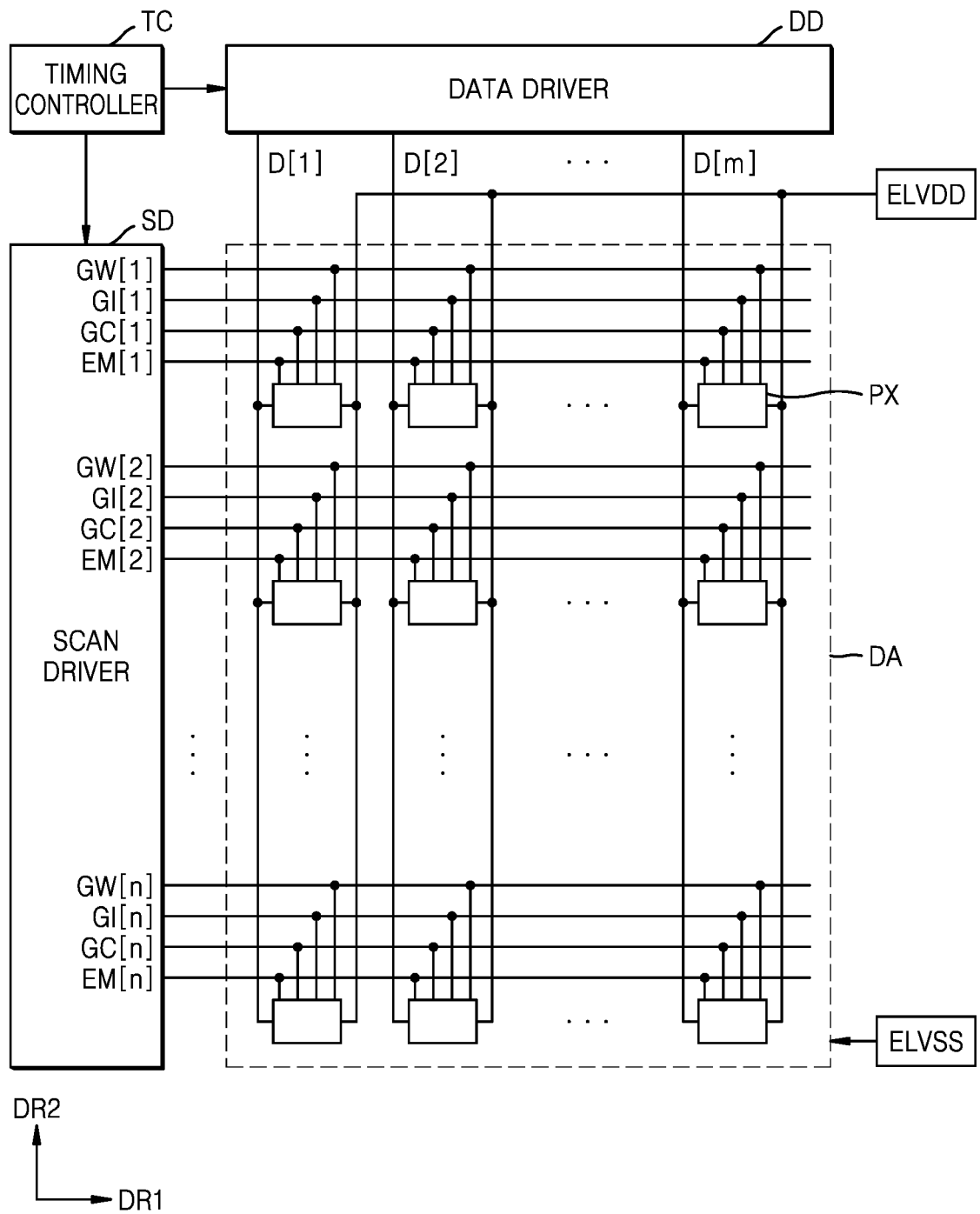
FIG. 1 is a conceptual view illustrating an organic light-emitting display apparatus according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a conceptual view illustrating an organic light-emitting display apparatus according to an embodiment.

A display apparatus according to an embodiment may be implemented as an electronic apparatus such as smartphones, mobile phones, navigation apparatuses, game consoles, televisions, head units for automobiles, notebook computers, lap-top computers, tablet computers, personal multimedia players (PMPs), and personal digital assistants (PDAs). In addition, an electronic apparatus may be a flexible apparatus.

An organic light-emitting display apparatus according to an embodiment includes a display area DA, a scan driver SD, a data driver DD, and a timing controller TC. The display area DA includes pixels PX. The timing controller TC is configured to control the scan driver SD and the data driver DD.

The scan driver SD is configured to supply scan signals GW[1] to GW[n], initialization signals GI[1] to GI[n], compensation control signals GC[1] to GC[n], and emission control signals EM[1] to EM[n] to scan lines extending in a first direction DR1 under control of the timing controller TC. As an example, the scan driver SD sequentially supplies scan signals GW[1] to GW[n], initialization signals GI[1] to GI[n], compensation control signals GC[1] to GC[n], and emission control signals EM[1] to EM[n] to scan lines, initialization lines, compensation control lines, and emission control lines, respectively.

Each of scan signals GW[1] to GW[n], initialization signals GI[1] to GI[n], compensation control signals GC[1] to GC[n], and emission control signals EM[1] to EM[n] may have a high voltage or a low voltage. The transistors may each be turned on when a high voltage is applied and turned off when a low voltage is applied, or turned off when a high voltage is applied and turned on when a low voltage is applied depending on a characteristic thereof.

The data driver DD is configured to supply data signals D[1] to D[m] to data lines extending in a second direction DR2 under control of the timing controller TC. The data driver DD supplies data signals D[1] to D[m] in synchronization with scan signals GW[1] to GW[n]. Accordingly, data signals D[1] to D[m] are supplied to pixels PX selected by scan signals GW[1] to GW[n].

The timing controller TC controls the scan driver SD and the data driver DD according to synchronization signals supplied from the outside.

A power voltage ELVDD and an electrode voltage ELVSS are supplied to pixels PX inside the display area DA. Pixels PX that are supplied with the power voltage ELVDD and the electrode voltage ELVSS control an amount of current flowing from a power voltage line to an electrode power line through an organic light-emitting diode according to data signals D[1] to D[m] and generate light having brightness corresponding to data signals D[1] to D[m]. The power voltage ELVDD is applied to the power voltage line, and the electrode voltage ELVSS is applied to the electrode power line.

Though it is shown in FIG. 1 that pixels PX inside the display area DA are sequentially arranged in the first direction DR1 and the second direction DR2, the embodiment is not limited thereto. As an example, pixels PX may be arranged in various configurations such as a pentile configuration and a mosaic configuration as well as a stripe configuration. In addition, the display area DA may have a rectangular shape in a plan view as shown in FIG. 1. Unlike this, the display area DA may have a polygonal shape such as a triangle, a pentagon, or a hexagon, a circular shape, an elliptical shape, or an irregular shape.

Figure 2:
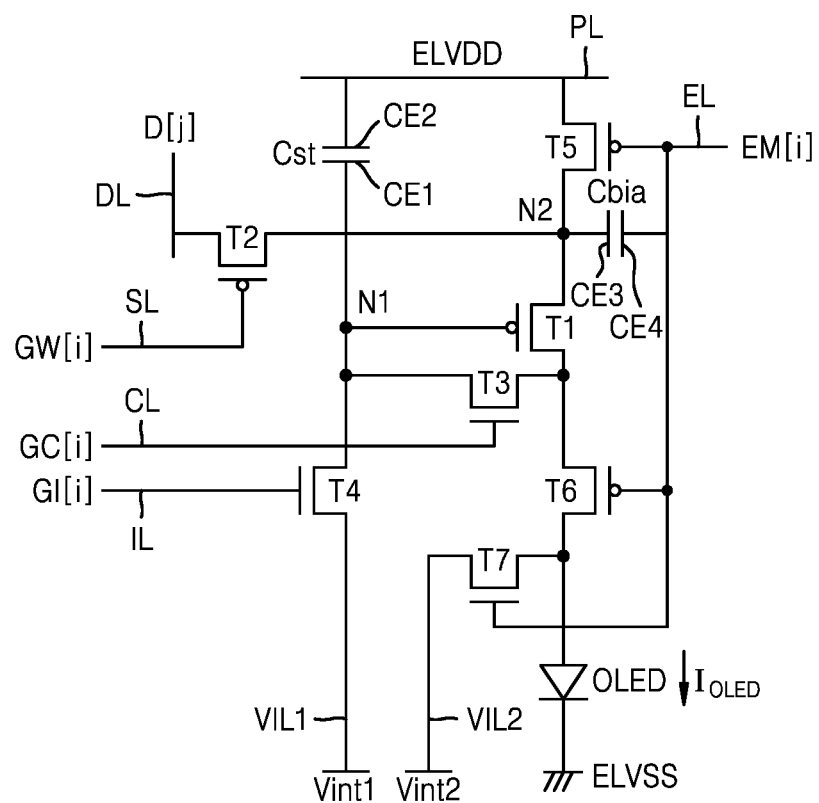
FIG. 2 is an equivalent circuit diagram of a pixel of the display apparatus in FIG. 1.

FIG. 2 is an equivalent circuit diagram of a pixel of the display apparatus in FIG.

Referring to FIG. 2, a pixel PX includes a first transistor T1 to a seventh transistor T7, a bias capacitor Cbia, a storage capacitor Cst, an organic light-emitting diode OLED, a first initialization voltage line VIL1, a second initialization voltage line VIL2, a power voltage line PL, and signal lines. The signal lines may include a data line DL, a scan line SL, an initialization line IL, a compensation control line CL, and an emission control line EL. At least one of the signal lines, the first initialization voltage line VIL1, the second initialization voltage line VIL2, and/or the power voltage line PL may be shared by pixels PX that are adjacent to each other.

The power voltage line PL may be configured to transfer the power voltage ELVDD to the first transistor T1. The first initialization voltage line VIL1 may be configured to transfer a first initialization voltage Vint1 to a pixel PX, the first initialization voltage Vint1 initializing the first transistor T1. The second initialization voltage line VIL2 may be configured to transfer a second initialization voltage Vint2 to a pixel PX, the second initialization voltage Vint2 initializing the organic light-emitting diode OLED. As an example, the first initialization voltage Vint1 may be about −5 V, and the second initialization voltage Vint2 may be about −7 V to about −6 V. Accordingly, the first initialization voltage Vint1 may be greater than the second initialization voltage Vint2.

The scan line SL, the initialization line IL, the compensation control line CL, the emission control line EL, the first initialization voltage line VIL1, and the second initialization voltage line VIL2 may extend in the first direction DR1 and be apart from each other on each row. The data line DL and the power voltage line PL may extend in the second direction DR2 and be apart from each other on each column.

It is illustrated in FIG. 2 that the third transistor T3, the fourth transistor T4, and the seventh transistor T7 among the first to seventh transistors T1, T2, T3, T4, T5, T6, and T7 are implemented as n-channel metal oxide semiconductor field-effect transistors (NMOS-FET), and the rest of the first to seventh transistors T1, T2, T3, T4, T5, T6, and T7 are implemented as p-channel metal oxide semiconductor field-effect transistors (PMOS-FET).

The first transistor T1 is connected to the power voltage line PL through the fifth transistor T5 and electrically connected to the organic light-emitting diode OLED through the sixth transistor T6. The first transistor T1 is a driving transistor, receives a data signal D[j] according to a voltage applied to a first node N1, and controls an amount of a driving current $I_{OLED}$ flowing from a second node N2 to the electrode power line through the organic light-emitting diode OLED, the second node N2 being connected to the power voltage line PL.

The second transistor T2, which is a switching transistor, is connected to the scan line SL and the data line D and connected to the power voltage line PL through the fifth transistor T5, which is an operation control transistor T5. The second transistor T2 on an i-th row of a total n rows is turned on according to a scan signal GW[i] received through the scan line SL and performs a switching operation of transferring a data signal D[j] to the second node N2, the data signal D[j] being transferred to a data line DL on a j-th column of a total m columns. Here, i is a natural number equal to or greater than 1 and equal to or less than n, and j is a natural number equal to or greater than 1 and equal to or less than m. As an example, the second transistor T2 may be turned on according to a scan signal GW[i] of a low voltage.

The third transistor T3, which is a compensation transistor, is connected to the compensation control line CL and connected to the organic light-emitting diode OLED through the sixth transistor T6, which is an emission control transistor. The third transistor T3 is turned on according to a compensation control signal GC[i] transferred through the compensation control line CL to diode-connect the first transistor T1. As an example, the third transistor T3 may be turned on according to a compensation control signal GC[i] of a high voltage.

The fourth transistor T4, which is a first initialization transistor, is connected to the initialization line IL and the first initialization voltage line VIL1, turned on according to an initialization signal GI[i] transferred through the initialization line IL, and transfers the first initialization voltage Vint1 from the first initialization voltage line VIL1 to a first gate electrode of the first transistor T1, thereby initializing the voltage of the first gate electrode of the first transistor T1. As an example, the fourth transistor T4 may be turned on according to an initialization signal GI[i] of a high voltage.

The fifth transistor T5, which is an operation control transistor, and the sixth transistor T6, which is an emission control transistor, are connected to the emission control line EL and simultaneous turned on according to an emission control signal EM[i] transferred through the emission control line EL to form a current path such that the driving current $I_{OLED}$ flows from the power voltage line PL to the organic light-emitting diode OLED. As an example, the fifth transistor T5 and the sixth transistor T6 may be turned on according to an emission control signal EM[i] of a low voltage.

The seventh transistor T7, which is the second initialization transistor, is connected to the emission control line EL and the second initialization voltage line VIL2, turned on according to an emission control signal EM[i] transferred through the emission control line EL, and transfers the second initialization voltage Vint2 from the second initialization voltage line VIL2 to the organic light-emitting diode OLED, thereby initializing the organic light-emitting diode OLED. As an example, the seventh transistor T7 may be turned on according to an emission control signal EM[i] of a high voltage. The seventh transistor T7 may be omitted.

The storage capacitor Cst includes a first capacitor electrode CE1 and a second capacitor electrode CE2. The first capacitor electrode CE1 is connected to the first gate electrode of the first transistor T1 or is one body with the first gate electrode of the first transistor T1, and the second capacitor electrode CE2 is connected to the power voltage line PL. The storage capacitor Cst may store and maintain a voltage corresponding to a difference between voltages of the power voltage line PL and the first gate electrode of first transistor T1, thereby maintaining a voltage applied to the first gate electrode of first transistor T1.

A bias capacitor Cbia connected between the second node N2 and the emission control line EL includes a third capacitor electrode CE3 and a fourth capacitor electrode CE4. The third capacitor electrode CE3 is connected to the power voltage line PL through the fifth transistor T5, and the fourth capacitor electrode CE4 is connected to the emission control line EL. When an emission control signal EM[i] of a high voltage is applied through the emission control line EL, the fifth transistor T5 and the sixth transistor T6 in which gate electrodes thereof are connected to the emission control line EL are turned off, and when an initialization signal GI[i] of a low voltage is applied through the initialization line IL, the fourth transistor T4 in which a gate electrode is connected to the initialization line IL is turned off. Accordingly, the first transistor T1 becomes an on-bias state and thus is initialized.

The first initialization voltage Vint1 may be about −5 V, and the second initialization voltage Vint2 may be about −7 V to about −6 V. As described above, the first initialization voltage Vint1 may be greater than the second initialization voltage Vint2. Accordingly, when the first transistor T1 becomes an on-bias state, a data voltage of a current frame that is input thereafter always becomes lower than the on-bias voltage and thus is independent of the voltage of a previous frame. Accordingly, a hysteresis issue and a step efficiency issue do not occur or an occurrence rate is reduced. For reference, a hysteresis issue means an issue in which a gate-source voltage versus source-drain current curve of the first transistor T1 when a data voltage of a current frame is higher than a data voltage of a previous frame becomes different from a gate-source voltage versus source-drain current curve of the first transistor T1 when a data voltage of a current frame is lower than a data voltage of a previous frame. A step efficiency issue means an issue in which, when a grayscale is rapidly changed on a frame basis, for example, when a grayscale of a previous frame is black and a grayscale of a current frame is white, due to the above-described change in the voltage versus current curve, brightness corresponding to an intermediate grayscale appears in a pixel instead of brightness corresponding to an aimed grayscale.

The organic light-emitting diode OLED includes a pixel electrode 310, an opposite electrode 330, and an intermediate layer 320 therebetween, the intermediate layer 320 including an emission layer. The electrode voltage ELVSS is applied to the opposite electrode 330 integrally formed as one body over a plurality of pixels PX. The organic light-emitting diode OLED receives the driving current $I_{OLED}$ from the first transistor T1 to emit light, thereby allowing the display apparatus to display an image. For reference, the opposite electrode 330 extends to the outside of the display area DA to be connected to the electrode power line. The electrode voltage ELVSS is applied to the electrode power line.

Figure 3:
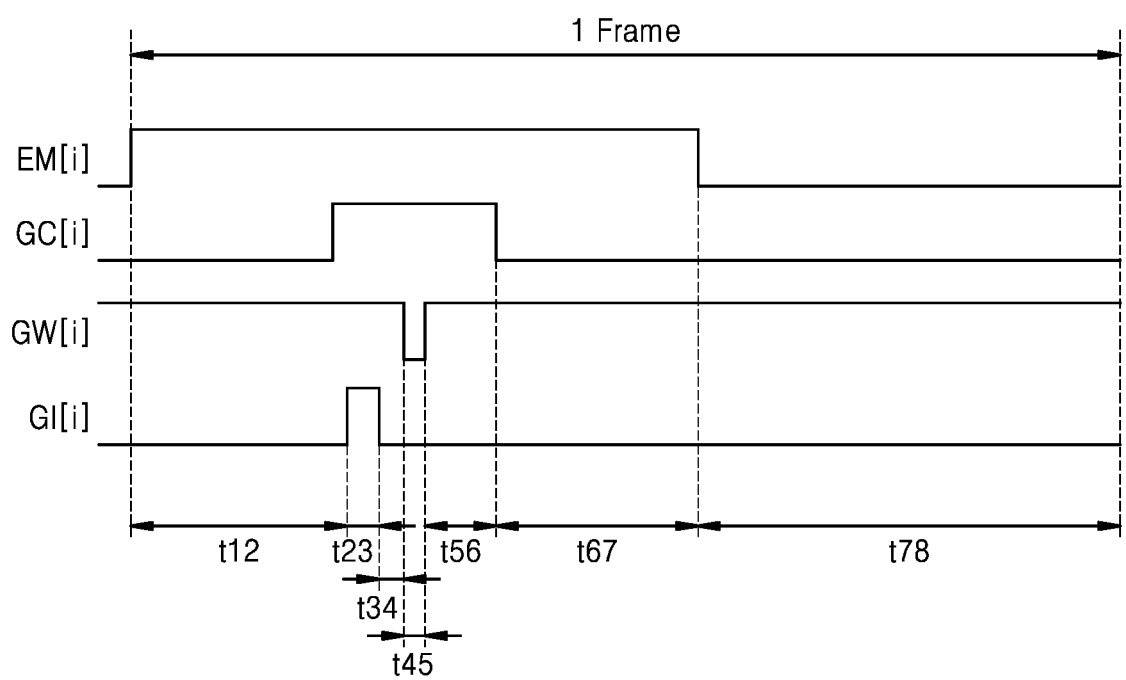
FIG. 3 is a waveform diagram illustrating a method of driving the equivalent circuit diagram in FIG. 2.

A specific operation of each pixel PX according to an embodiment is described with reference to FIG. 3, which is a waveform diagram illustrating a method of driving the equivalent circuit diagram shown in FIG. 2.

First, during a period t12, an emission control signal EM[i] of a high voltage is applied to pixels PX on an i-th row through the emission control line EL, a compensation control signal GC[i] of a low voltage is applied to pixels PX on an i-th row through the compensation control line CL, a scan signal GW[i] of a high voltage is applied to pixels PX on an i-th row through the scan line SL, and an initialization signal GI[i] of a low voltage is applied to pixels PX on an i-th row through the initialization line IL. Accordingly, because the second transistor T2 to the sixth transistor T6 are turned off, the first transistor T1 becomes an on-bias state due to the bias capacitor Cbia and thus is initialized. In this case, the seventh transistor T7 is turned on and a current does not flow through the organic light-emitting diode OLED and flows through the second initialization voltage line VIL2. Accordingly, the organic light-emitting diode OLED is initialized.

Next, during a period t23, a compensation control signal GC[i] and an initialization signal GI[i] are changed to a high voltage. Accordingly, the third transistor T3 and the fourth transistor T4 are turned on and the voltage of the first gate electrode of the first transistor T1 is initialized by the first initialization voltage Vint1 supplied from the first initialization voltage line VIL1.

In addition, during a period t34, an initialization signal GI[i] is changed to a low voltage and the fourth transistor T4 is turned off. Next, during a period t45, a scan signal GW[i] is changed to a low voltage, and the second transistor T2 is turned on. Accordingly, during a period t45, a voltage corresponding to a data signal D[j] supplied from the data line DL is applied to the second node N2. Next, during a period t56, a scan signal GW[i] is changed to a high voltage, and the second transistor T2 is turned off. Because the third transistor T3 is maintained at a turn-on state, the first transistor T1 is diode-connected and forward-biased by the third transistor T3. As a result, a voltage in which a threshold voltage Vth of the first transistor T1 is compensated for from a data signal D[j] supplied from the data line DL is applied to the first gate electrode of the first transistor T1, that is, the first node N1. Accordingly, the power voltage ELVDD and the compensated voltage are applied to two opposite ends of the storage capacitor Cst, and charge corresponding to a voltage difference between the two opposite ends is stored in the storage capacitor Cst.

Next, during a period t67, a compensation control signal GC[i] is changed to a low voltage and the third transistor T3 becomes a turn-off state. During a period t78, an emission control signal EM[i] is changed to a low voltage, the seventh transistor T7 becomes a turn-off state, the fifth transistor T5 and the sixth transistor T6 become a turn-on state, and the driving current $I_{OLED}$ corresponding to a voltage difference between the voltage of the first gate electrode of the first transistor T1 and the power voltage ELVDD occurs. The driving current $I_{OLED}$ is supplied to the organic light-emitting diode OLED through the sixth transistor T6, and the organic light-emitting diode OLED emits light.

In an embodiment, at least one of the first transistor T1 to the seventh transistor T7 includes a semiconductor layer including an oxide and the rest of the transistors include a semiconductor layer including silicon. Specifically, the first transistor T1 directly influencing the brightness of the display apparatus includes a semiconductor layer including polycrystalline silicon having high reliability. Through this, a high-resolution display apparatus may be implemented.

In addition, because an oxide semiconductor has high carrier mobility and a low leakage current, a voltage drop is not large even though a driving time is long. That is, when a thin-film transistor including an oxide semiconductor is used, a color change of an image resulted from a voltage drop is not large even though the thin-film transistor is driven in low frequencies. Because an oxide semiconductor has an advantage of a small leakage current, at least one of the third transistor T3 and the fourth transistor T4 connected to the first gate electrode of the first transistor T1 may include an oxide semiconductor, and thus, a leakage current that may flow to the first gate electrode of the first transistor T1 may be prevented, and simultaneously, power consumption may be reduced. In addition, the seventh transistor T7 may include an oxide semiconductor, the seventh transistor T7 preventing a current from flowing through the organic light-emitting diode OLED before the organic light-emitting diode OLED starts to emit light according to an emission control signal EM[i]. Accordingly, a leakage current that may flow through the organic light-emitting diode OLED may be prevented, and simultaneously, power consumption may be reduced.

Figure 4:
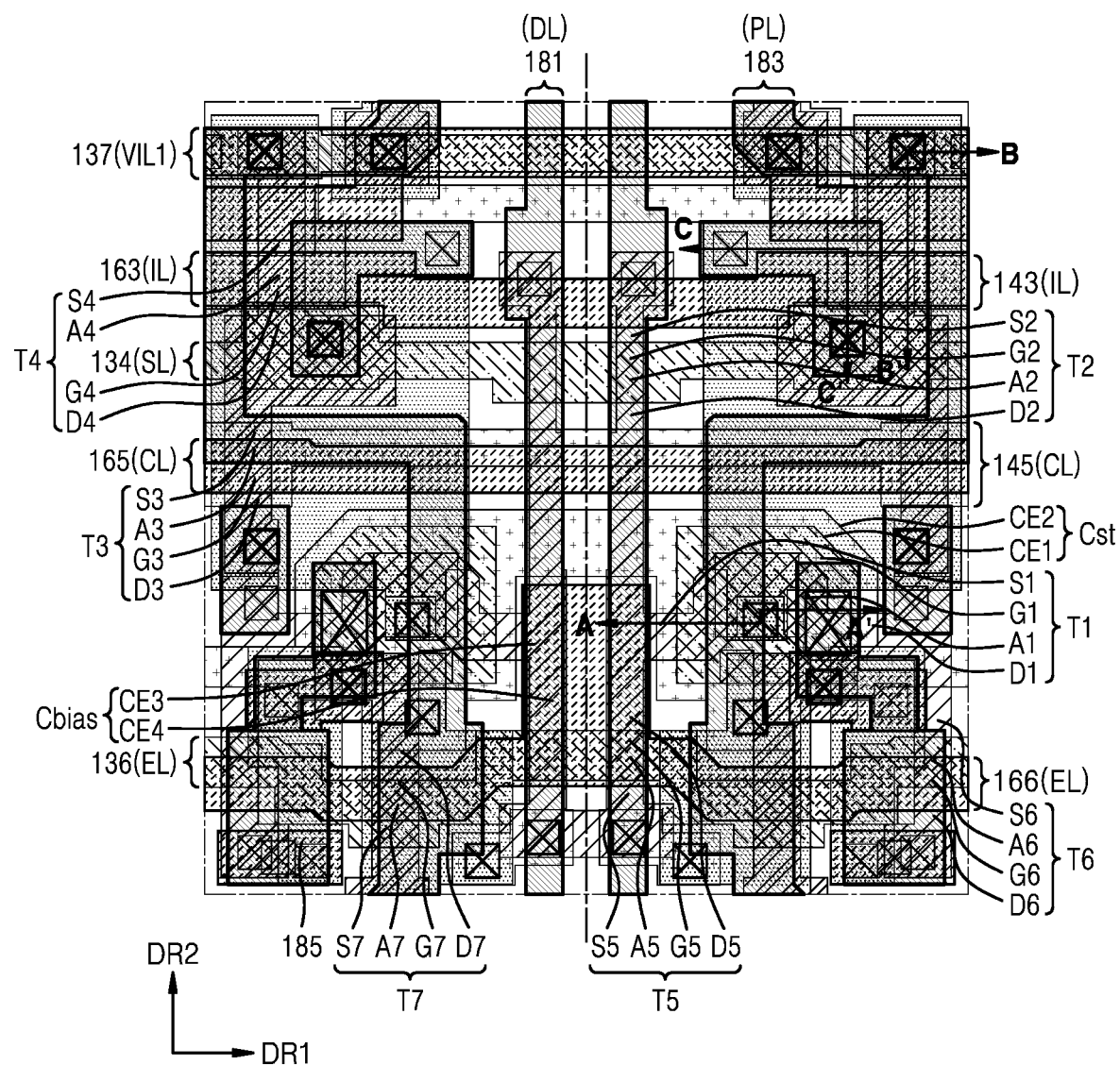
FIG. 4 is a layout view illustrating positions of transistors and capacitors of a pixel in FIG. 2.

FIG. 4 is a layout view illustrating positions of transistors and capacitors of a pixel in FIG. 2. FIG. 4 illustrates a pair of pixels PX arranged on the same row of adjacent columns. A pixel circuit of a pixel arranged on a left pixel area illustrated in FIG. 4 and a pixel circuit of a pixel arranged on a right pixel area illustrated in FIG. 4 have a horizontally symmetric structure. For reference, for convenience of description, FIG. 4 does not illustrate the organic light-emitting diode OLED. That is, FIG. 4 is a layout view illustrating a position of a pixel circuit of pixels.

Figure 9:
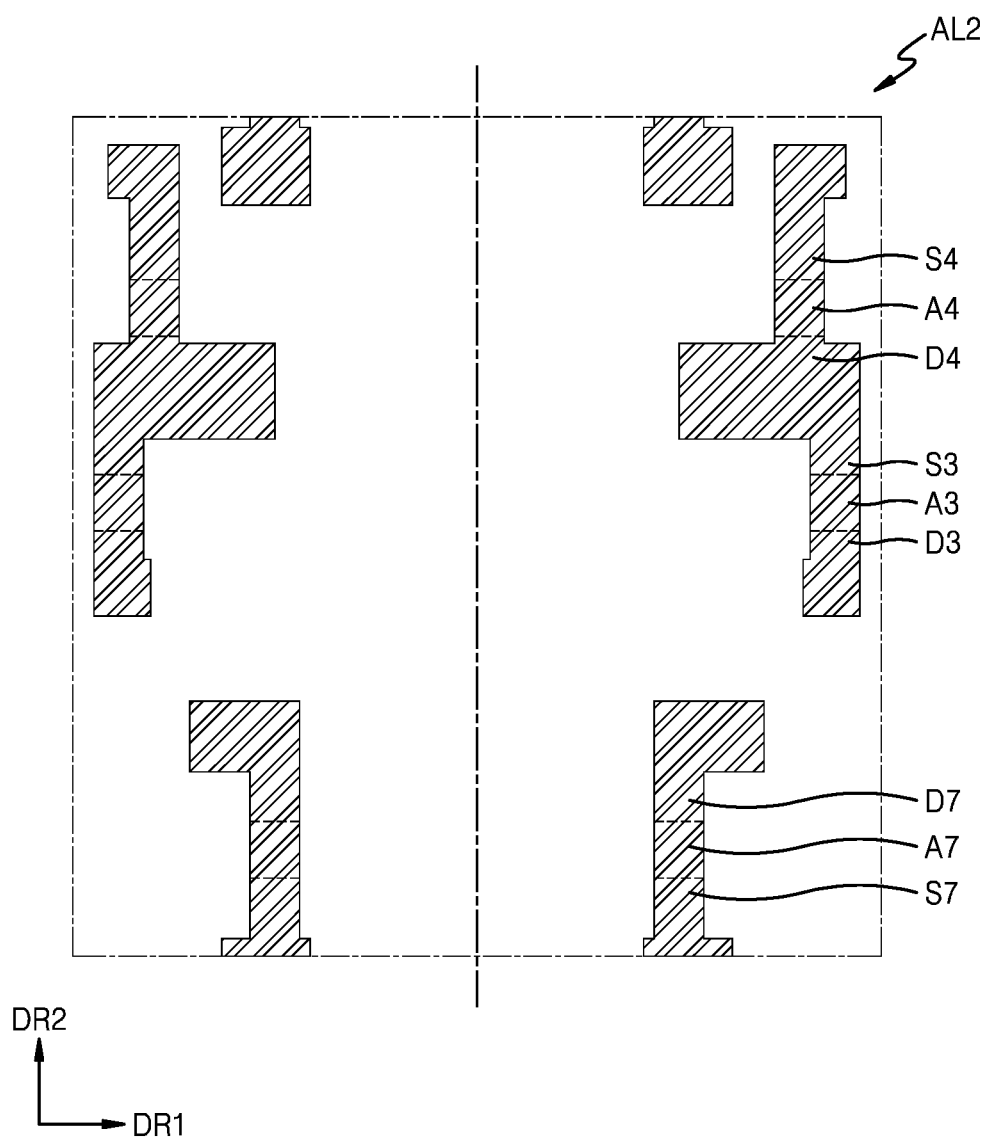
Figure 10:
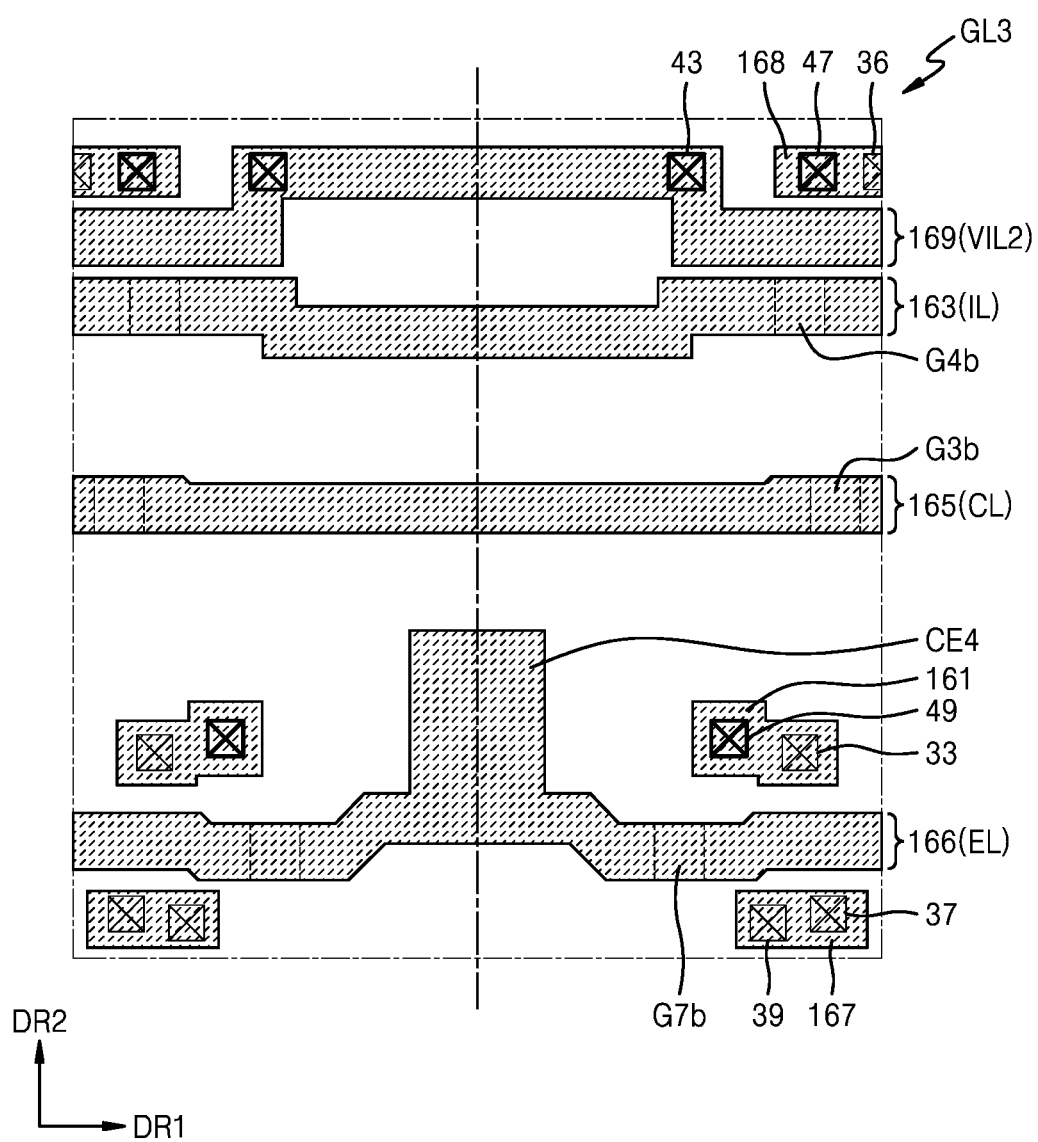
Figure 11:
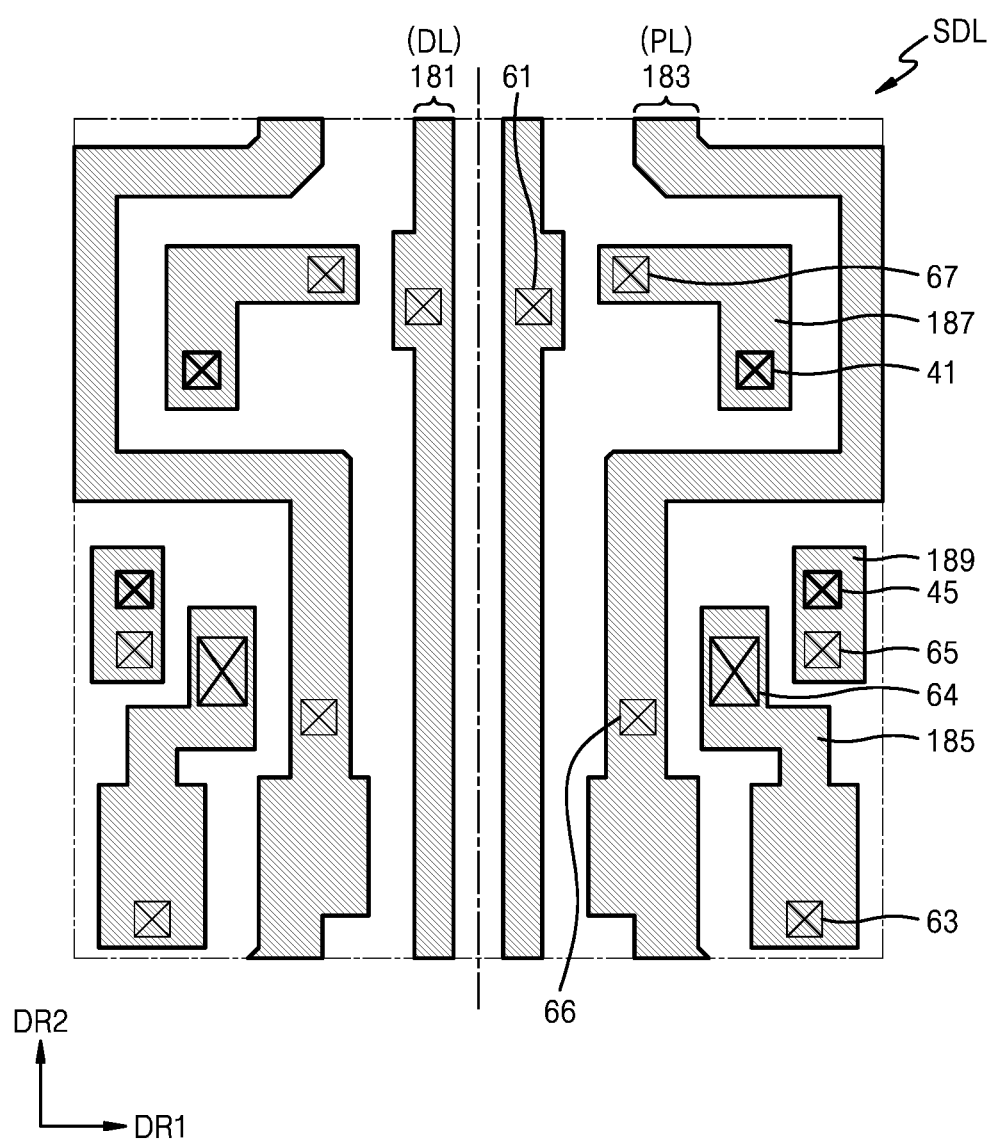
Figure 12:
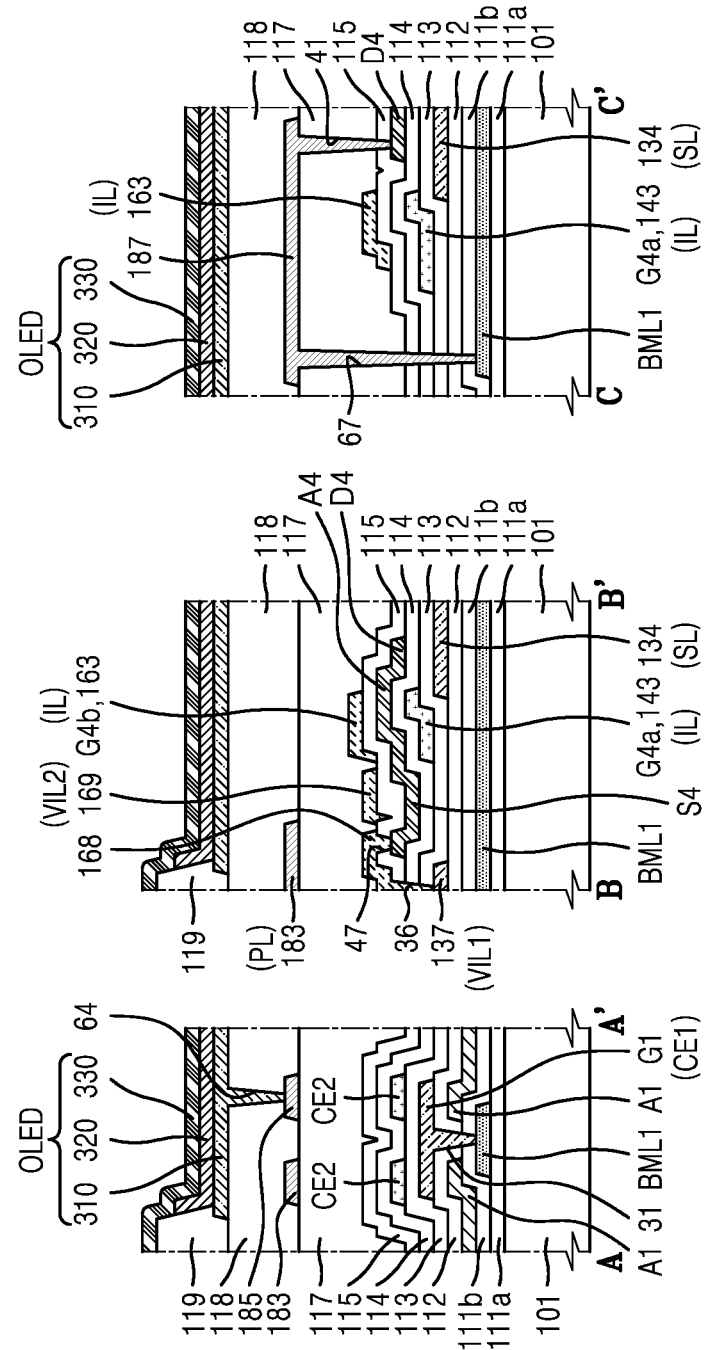
FIG. 12 is a cross-sectional view of the display apparatus, taken along lines A-A', B-B', and C-C' of FIG. 4.

FIGS. 5 to 11 are layout views of elements such as the transistors and the capacitors of FIG. 4 for each layer. FIG. 12 is a cross-sectional view of the display apparatus, taken along lines A-A', B-B', and C-C' of FIG. 4. As sequentially illustrated in FIGS. 5 to 11, a bottom metal layer BML of FIG. 5, a first active layer AL1 of FIG. 6, a first gate layer GL1 of FIG. 7, a second gate layer GL2 of FIG. 8, a second active layer AL2 of FIG. 9, a third gate layer GL3 of FIG. 10, and a source-drain layer SDL of FIG. 11 are disposed in a direction away from a substrate from near the substrate.

In addition, insulating layers are disposed between these layers. In detail, a first buffer layer 111a may be disposed between the substrate 101 and the bottom metal layer BML of FIG. 5, a second buffer layer 111b may be disposed between the bottom metal layer BML of FIG. 5 and the first active layer AL1 of FIG. 6, a first gate insulating layer 112 may be disposed between the first active layer AL1 of FIG. 6 and the first gate layer GL1 of FIG. 7, a second gate insulating layer 113 may be disposed between the first gate layer GL1 of FIG. 7 and the second gate layer GL2 of FIG. 8, a third gate insulating layer 114 may be disposed between the second gate layer GL2 of FIG. 8 and the second active layer AL2 of FIG. 9, a fourth gate insulating layer 115 may be disposed between the second active layer AL2 of FIG. 9 and the third gate layer GL3 of FIG. 10, and an interlayer insulating layer 117 may be disposed between the third gate layer GL3 of FIG. 10 and the source-drain layer SDL of FIG. 11. These insulating layers may include silicon oxide, silicon nitride, silicon oxynitride, aluminum oxide, titanium oxide, tantalum oxide, hafnium oxide, and/or zinc oxide. The insulating layers may each have a single layer or a multi-layer when implemented. Elements of different layers may be electrically connected to each other through contact holes defined in the insulating layers.

Figure 5:
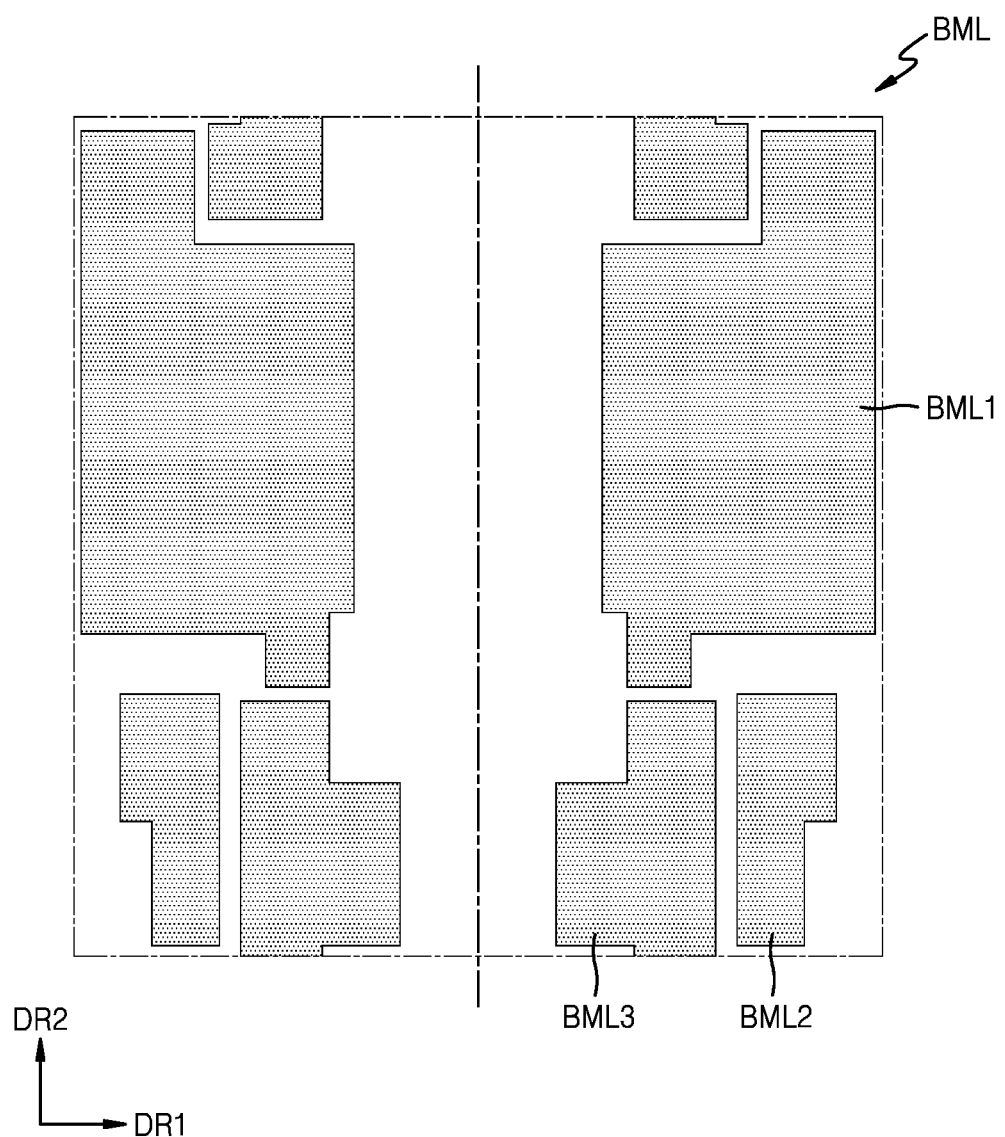
FIGS. 5, 6, 7, 8, 9, 10, and 11 are layout views of elements such as the transistors and the capacitors of FIG. 4 for each layer.

The bottom metal layer BML illustrated in FIG. 5 may include metal such as silver, copper, or aluminum. The bottom metal layer BML may protect the second active layer AL2. In addition, the bottom metal layer BML serves as a wiring electrically connecting various elements of the display apparatus to each other. This is described below.

As illustrated in FIG. 12, for example, the bottom metal layer BML is disposed over a substrate 101. The substrate 101 may include glass, metal, or a polymer resin. In the case where at least a portion of the display apparatus is bent or the display apparatus is flexible, the substrate 101 may be configured to be flexible or bendable. In this case, the substrate 101 may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. In addition, the substrate 101 may include a multi-layered structure including two layers and a barrier layer therebetween including an inorganic material (e.g., silicon oxide, silicon nitride, silicon oxynitride, etc.), the two layers including the polymer resin. Various modifications may be made.

The first buffer layer 111*a* may be disposed between the substrate 101 and the bottom metal layer BML. The second buffer layer 111*b* may be disposed on the bottom metal layer BML. The first buffer layer 111*a* and/or the second buffer layer 111*b* may prevent metal atoms or impurities from the substrate 101 or the bottom metal layer BML from diffusing to the first active layer AL1, etc. The buffer layer may have a single-layered structure or a multi-layered structure when implemented. In the multi-layered structure, a portion of the layers may be referred to as a barrier layer.

Figure 6:
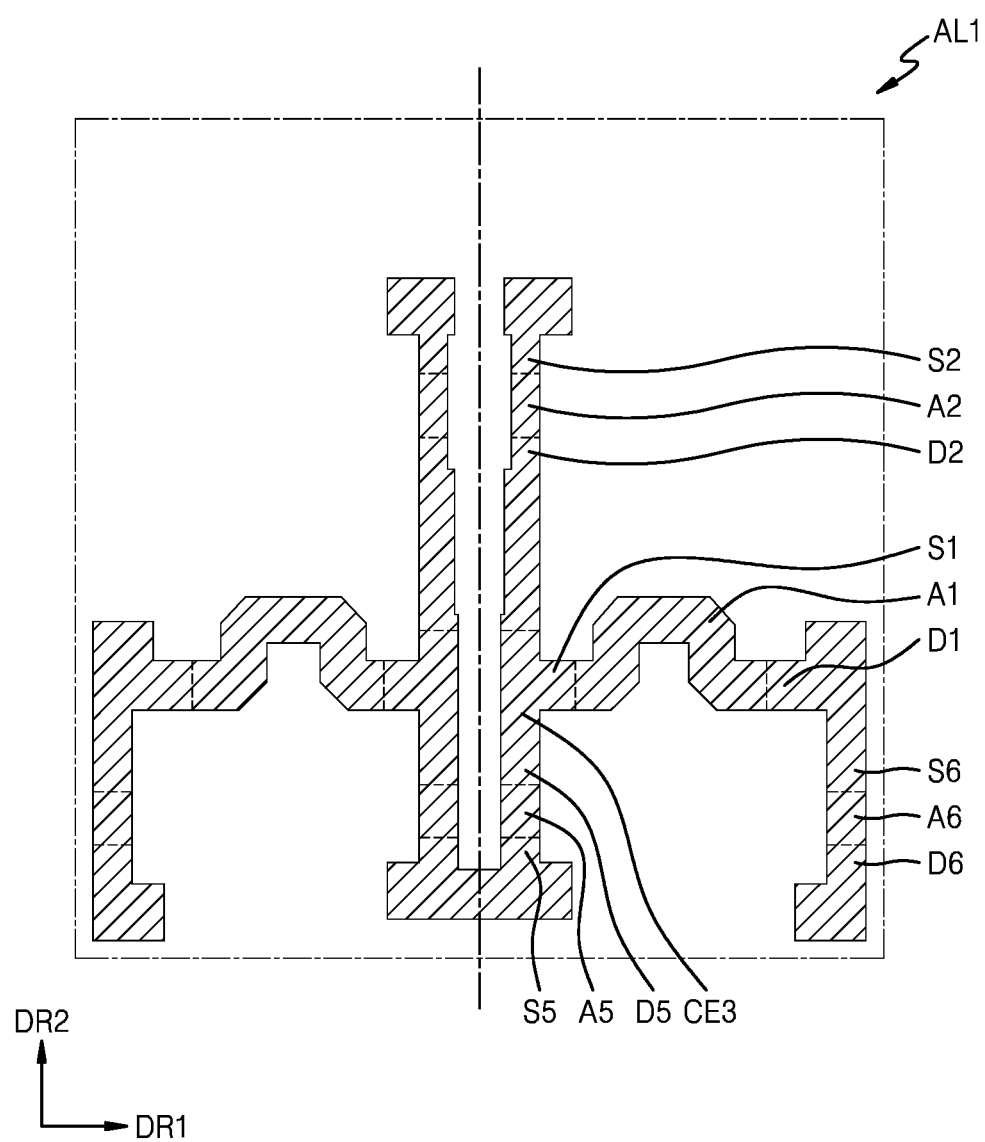

As illustrated in FIG. 6, the first active layer AL1 may include a semiconductor layer having polycrystalline silicon. Source regions and drain regions of the first active layer AL1 may be doped with impurities. The impurities may include N-type impurities or P-type impurities. A source region and a drain region may respectively correspond to a source electrode and a drain electrode. A source region and a drain region may be exchanged with each other according to a characteristic of a transistor. Hereinafter, a source region and a drain region are used instead of a source electrode and a drain electrode. It is illustrated in the equivalent circuit diagram of FIG. 2 that specific portions of the first active layer AL1 are doped with P-type impurities and the first transistor T1, the second transistor T2, the fifth transistor T5, and the sixth transistor T6 are implemented as PMOS-FET. In addition, other portions of the first active layer AL1 may be doped with impurities to serve as wirings electrically connecting transistors and/or capacitors or serve as a capacitor electrode, etc.

Figure 7:
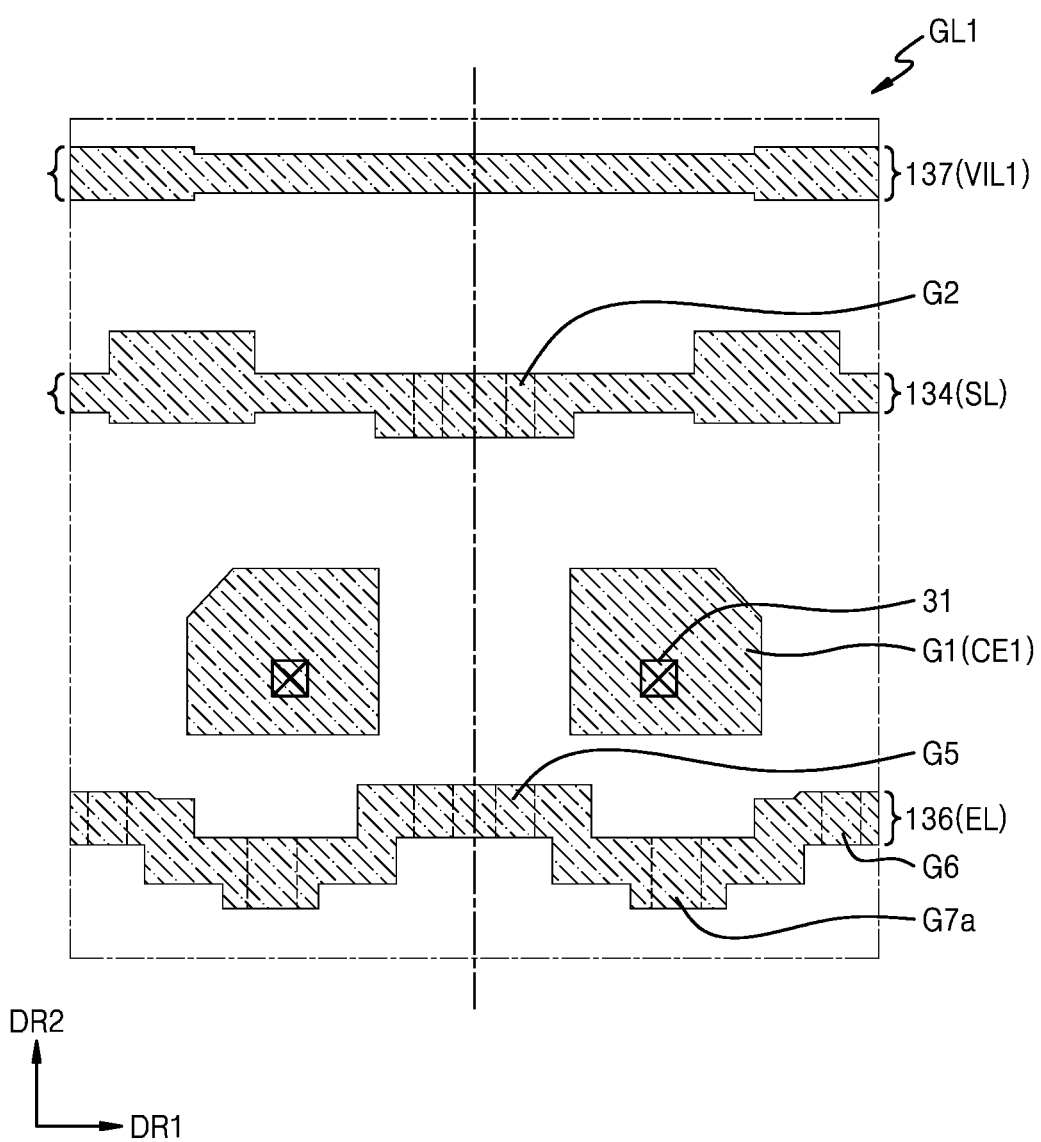
Figure 8:
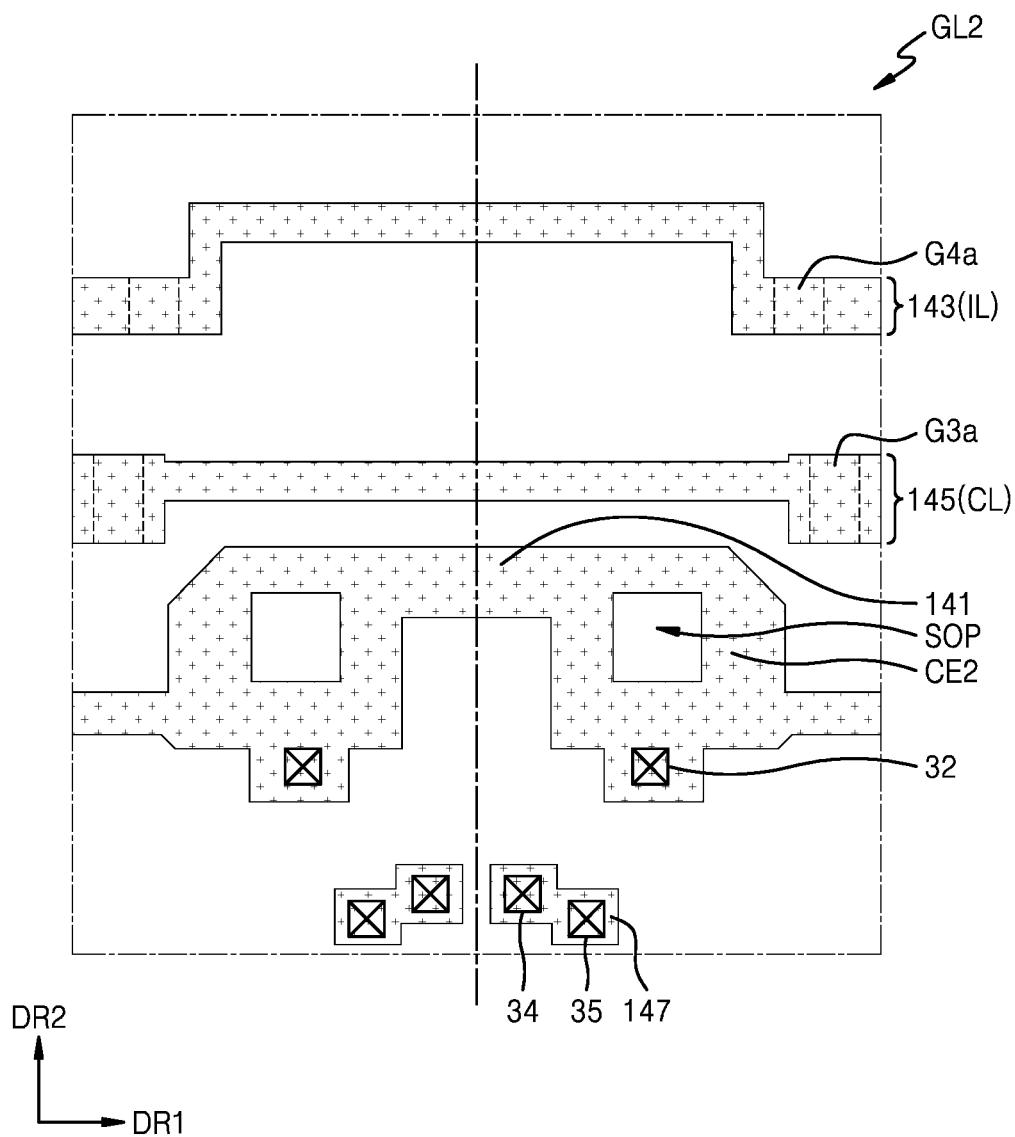

The first gate layer GL1 of FIG. 7, the second gate layer GL2 of FIG. 8, and the third gate layer GL3 of FIG. 10 may each include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (T1), tungsten (W), and copper (Cu). Each layer may have a single-layered structure or a multi-layered structure. In the case where each layer has a multi-layered structure, the layer may include various materials. As an example, the first gate layer GL1 of FIG. 7, the second gate layer GL2 of FIG. 8, and the third gate layer GL3 of FIG. 10 may each have a two-layered structure of molybdenum layer/aluminum layer or a three-layered structure of molybdenum layer/aluminum layer/molybdenum layer.

The second active layer AL2 of FIG. 9 may include a semiconductor layer including an oxide. As an example, the second active layer AL2 may include Zn-oxide-based material and include, for example, Zn-oxide, In—Zn oxide, or Ga—In—Zn oxide. Because various modifications may be made, the second active layer AL2 may include an oxide semiconductor such as In-Ga—Zn-O (IGZO), In—Sn—Zn—O (ITZO), or In—Ga—Sn—Zn—O (IGTZO) semiconductor containing metal such as indium (In), gallium (Ga), and stannum (Sn) in ZnO.

For reference, a contact hole 31 illustrated in FIG. 7 is defined in the second buffer layer 111*b* and the first gate insulating layer 112 to electrically connect the layer shown in FIG. 7 to the bottom metal layer BML of FIG. 5 disposed therebelow. Contact holes 32 and 35 illustrated in FIG. 8 are defined in the second buffer layer 111*b*, the first gate insulating layer 112, and the second gate insulating layer 113 to electrically connect the layer shown in FIG. 8 to the bottom metal layer BML of FIG. 5 disposed therebelow. A contact hole 34 illustrated in FIG. 8 is defined in the first gate insulating layer 112 and the second gate insulating layer 113 to electrically connect the layer shown in FIG. 8 to the first active layer AL1 of FIG. 6 disposed therebelow.

In addition, a contact hole 36 illustrated in FIG. 10 is defined in the second gate insulating layer 113 to the fourth gate insulating layer 115 to electrically connect the layer shown in FIG. 10 to the first gate layer GL1 of FIG. 7 disposed therebelow. Contact holes 33 and 39 illustrated in FIG. 10 are defined in the second buffer layer 111*b* and the first gate insulating layer 112 to the fourth gate insulating layer 115 to electrically connect the layer illustrated in FIG. 10 to the bottom metal layer BML of FIG. 5 disposed therebelow. A contact hole 37 illustrated in FIG. 10 is defined in the first gate insulating layer 112 to the fourth gate insulating layer 115 to electrically connect the layer illustrated in FIG. 10 to the first active layer AL1 of FIG. 6 disposed therebelow. Contact holes 43, 47, and 49 illustrated in FIG. 10 are defined in the fourth insulating layer 115 to electrically connect the layer illustrated in FIG. 10 to the second active layer AL2 of FIG. 9 disposed therebelow.

The source-drain layer SDL of FIG. 11 may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (T1), tungsten (W), and copper (Cu). These layers may each have a single-layered structure or a multi-layered structure. In the case where each layer has a multi-layered structure, the layer may include various materials. As an example, the source-drain layer SDL may have a two-layered structure of titanium layer/aluminum layer or a three-layered structure of titanium layer/aluminum layer/titanium layer.

For reference, contact holes 61 and 65 illustrated in FIG. 11 are defined in the first gate insulating layer 112 to the fourth insulating layer 115 and the interlayer insulating layer 117 to electrically connect the layer illustrated in FIG. 11 to the first active layer AL1 of FIG. 6 disposed therebelow. A contact hole 67 illustrated in FIG. 11 is defined in the second buffer layer 111*b*, the first gate insulating layer 112 to the fourth gate insulating layer 115 and the interlayer insulating layer 117 to electrically connect the layer illustrated in FIG. 11 to the bottom metal layer BML of FIG. 5 disposed therebelow. A contact hole 66 illustrated in FIG. 11 is defined in the third gate insulating layer 114, the fourth gate insulating layer 115 and the interlayer insulating layer 117 to electrically connect the layer illustrated in FIG. 11 to the second gate layer GL2 of FIG. 8 disposed therebelow. Contact holes 41 and 45 illustrated in FIG. 11 are defined in the fourth gate insulating layer 115 and the interlayer insulating layer 117 to electrically connect the layer shown in FIG. 11 to the second active layer AL2 of FIG. 9 disposed therebelow. A contact hole 63 illustrated in FIG. 11 is defined in the interlayer insulating layer 117 to electrically connect the layer illustrated in FIG. 11 to the connection electrode 167 of FIG. 10 disposed therebelow.

Though a contact hole 64 is illustrated in FIG. 11 for convenience of description, the contact hole 64 is not a contact hole connecting a connection electrode 185 to a layer disposed therebelow. The contact hole 64 is defined in a planarization layer 118 covering the source-drain layer SDL illustrated in FIG. 11 to electrically connect the pixel electrode 310 of the organic light-emitting diode OLED disposed on the planarization layer 118 to the connection electrode 185. The planarization layer 118 may include an organic material such as acryl, benzocyclobutene (BCB), polyimide, or hexamethyldisiloxane (HMDSO). The embodiment is not limited thereto and the planarization layer 118 may include an inorganic material, and have a single-layered structure or a multi-layered structure when implemented.

The pixel circuit includes the scan line SL, the initialization line IL, the compensation control line CL, the emission control line EL, the first initialization voltage line VIL1, and the second initialization voltage line VIL2 each extending in the first direction DR1 and includes the data line DL and the power voltage line PL each extending in the second direction DR2 that crosses the first direction DR1.

The first initialization voltage line VIL1 (137), the scan line SL (134), and the bottom emission control line 136 of the emission control line EL may include the same material as that of the first gate electrode G1 and be disposed in the first gate layer GL1 together with the first gate electrode G1 as illustrated in FIG. 7. The second initialization voltage line VIL2 (169) may be disposed in the third gate layer GL3 as illustrated in FIG. 10.

In addition, some of the wirings may include two conductive layers disposed on different layers. As an example, the initialization line IL may include a bottom initialization line 143 and a top initialization line 163 disposed on different layers. As illustrated in FIG. 8, the bottom initialization line 143 may include the same material as that of the second capacitor electrode CE2 of the storage capacitor Cst and be disposed in the second gate layer GL2 together with the second capacitor electrode CE2. As illustrated in FIG. 10, the top initialization line 163 may include the same material as that of the fourth capacitor electrode CE4 of the bias capacitor Cbia and be disposed in the third gate layer GL3 together with the fourth capacitor electrode CE4.

The bottom initialization line 143 in the second gate layer GL2 may overlap at least a portion of the top initialization line 163 in the third gate layer GL3. In addition, the bottom initialization line 143 may be electrically connected to the top initialization line 163. As an example, the bottom initialization line 143 may contact the top initialization line 163 outside the display area DA or be electrically connected to the top initialization line 163 through a connection electrode. Because a first portion, which is a portion G4a of the bottom initialization line 143, and a second portion, which is a portion G4b of the top initialization line 163, are elements of a fourth gate electrode G4 of the fourth transistor T4, the fourth transistor T4 may have a double gate structure including control electrodes respectively above and below the semiconductor layer. That is, the first portion, which is the portion G4a of the bottom initialization line 143, is a 4-$1^{st}$ gate electrode, and the second portion, which is the portion G4b of the top initialization line 163 is a 4-$2^{nd}$ gate electrode. The fourth gate electrode G4 of the fourth transistor T4 may have a double gate structure including the 4-$1^{st}$ gate electrode and the 4-$2^{nd}$ gate electrode. The portion G4a of the bottom initialization line 143 may be substantially a same size as the portion G4b of the top initialization line 163.

In addition, the compensation control line CL may include a bottom compensation control line 145 and a top compensation control line 165 disposed on different layers. As illustrated in FIG. 8, the bottom compensation control line 145 of the second gate layer GL2 may include the same material as that of the second capacitor electrode CE2 of the storage capacitor Cst and be disposed on the same layer as the second capacitor electrode CE2. FIG. 8 illustrates that both the bottom compensation control line 145 and the second capacitor electrode CE2 are in the second gate layer GL2. As illustrated in FIG. 10, the top compensation control line 165 of the third gate layer GL3 may include the same material as that of the fourth capacitor electrode CE4 of the bias capacitor Cbia and be disposed on the same layer as the fourth capacitor electrode CE4. FIG. 10 illustrates that both the top compensation control line 165 and the fourth capacitor electrode CE4 are in the third gate layer GL3.

The bottom compensation control line 145 may at least partially overlap the top compensation control line 165. In addition, the bottom compensation control line 145 may be electrically connected to the top compensation control line 165. As an example, the bottom compensation control line 145 and the top compensation control line 165 may contact each other in the outside of the display area DA, or be electrically connected to each other through a connection electrode. Because a portion G3a of the bottom compensation control line 145 and a portion G3b of the top compensation control line 165 are elements of the third gate electrode G3 of the third transistor T3, the third transistor T3 may have a double gate structure including control electrodes respectively above and below the semiconductor layer. The portion G3a of the bottom compensation control line 145 may be larger than the portion G3b of the top compensation control line 165 in the second direction DR2.

In addition, the emission control line EL may include a bottom emission control line 136 and a top emission control line 166 disposed on different layers. The bottom emission control line 136 of the first gate layer GL1 may include the same material as that of the first gate electrode G1 and be disposed on the same layer as the first gate electrode G1 as illustrated in FIG. 7. FIG. 7 illustrates that both the bottom emission control line 136 and the first gate electrode G1 are disposed in the first gate layer GL1. The top emission control line 166 of the third gate layer GL3 may include the same material as that of the fourth capacitor electrode CE4 of the bias capacitor Cbia and be disposed on the same layer as the fourth capacitor electrode CE4 as illustrated in FIG. 10. FIG. 10 illustrates that both the top emission control line 166 and the fourth capacitor electrode CE4 are disposed in the third gate layer GL3. Specifically, the top emission control line 166 may be one body with the fourth capacitor electrode CE4.

The bottom emission control line 136 may at least partially overlap the top emission control line 166. In addition, the bottom emission control line 136 may be electrically connected to the top emission control line 166. As an example, the bottom emission control line 136 and the top emission control line 166 may contact each other in the outside of the display area DA, or be electrically connected to each other through a connection electrode. Because a third portion, which is a portion G7a of the bottom emission control line 136, and a fourth portion, which is a portion G7b of the top emission control line 166, are portions overlapping the second active layer AL2 and are elements of a seventh gate electrode G7 of the seventh transistor T7, the seventh transistor T7 may have a double gate structure including control electrodes respectively above and below the semiconductor layer. That is, the third portion, which is the portion G7a of the bottom emission control line 136, is a 7-$1^{st}$ gate electrode, and the fourth portion, which is the portion G7b of the top emission control line 166, is a 7-$2^{nd}$ gate electrode. The seventh gate electrode G7 of the seventh transistor T7 may have a double gate structure including the 7-$1^{st}$ gate electrode and the 7-$2^{nd}$ gate electrode. The portion G7a of the bottom emission control line 136 may be larger than the portion G7b of the top emission control line 166 in the second direction DR2.

The pixel circuit may include the first transistor T1 to the seventh transistor T7, the storage capacitor Cst, and the bias capacitor Cbia.

The first transistor T1, the second transistor T2, the fifth transistor T5, and the sixth transistor T6 may each be thin-film transistors including a silicon semiconductor. The third transistor T3, the fourth transistor T4, and the seventh transistor T7 may each be thin-film transistors including an oxide semiconductor.

The semiconductor layers of the first transistor T1, the second transistor T2, the fifth transistor T5, and the sixth transistor T6 are disposed on the same layer and include the same material as illustrated in FIG. 6. As an example, the semiconductor layers of the first transistor T1, the second transistor T2, the fifth transistor T5, and the sixth transistor T6 may include polycrystalline silicon. The semiconductor layers of the first transistor T1, the second transistor T2, the fifth transistor T5, and the sixth transistor T6 may be connected to each other and bent in various shapes as illustrated in FIG. 6.

The semiconductor layers of the first transistor T1, the second transistor T2, the fifth transistor T5, and the sixth transistor T6 may each include an active region, a source region, and a drain region, the active region being a channel region, and the source region and the drain region being respectively on two opposite sides of the active region. As an example, the source region and the drain region may be doped with impurities. The impurities may include N-type impurities or P-type impurities. The source region and the drain region may respectively correspond to a source electrode and a drain electrode. The source region and the drain region may be exchanged with each other depending on a characteristic of a transistor. Hereinafter, a source region and a drain region are used instead of a source electrode and a drain electrode.

The first transistor T1, which is a driving transistor, includes a first semiconductor layer and a first gate electrode G1. The first semiconductor layer, which is a driving semiconductor layer, includes a first active region A1, a first source region S1, and a first drain region D1, the first source region S1 and the first drain region D1 respectively being on two opposite sides of the first active region A1. The first semiconductor layer may have a bent shape, and thus, the first active region A1 may be longer than other active regions A2 to A7. As an example, because the first semiconductor layer has a shape that is bent multiple times such as '⌐', '⌐', 'S', 'M', 'W', etc., a long channel may be formed in a narrow space. Because the first active region A1 is long, a driving range of a gate voltage applied to the first gate electrode G1, which is a driving gate electrode, is widened. Accordingly, the grayscale of light emitted from the organic light-emitting diode OLED may be more precisely controlled and display quality may be improved. When implemented, the first semiconductor layer may have a straight line shape instead of a bent shape. As described below, because the first capacitor electrode CE1 of the first gate layer GL1 is electrically connected to a first bottom metal layer BML1 disposed therebelow through the contact hole 31, the first active region A1 of the first semiconductor layer, which is the driving semiconductor layer, may be bent to be a shape surrounding a portion of the contact hole 31.

As illustrated in FIG. 7, the first gate electrode G1 may have an isolated shape and overlap the first active region A1. As described above, the first gate insulating layer 112 may be disposed between the first active region A1 and the first gate electrode G1.

The storage capacitor Cst (illustrated in FIG. 4) may overlap the first transistor T1. The storage capacitor Cst includes the first capacitor electrode CE1 and the second capacitor electrode CE2. The first gate electrode G1 may serve as the first capacitor electrode CE1 of the storage capacitor Cst as well as a control electrode of the first transistor T1. That is, the first gate electrode G1 and the first capacitor electrode CE1 may be integrally formed as one body. The second capacitor electrode CE2 of the storage capacitor Cst is disposed over the first capacitor electrode CE1 to overlap the first capacitor electrode CE1. Because the second gate insulating layer 113 is disposed between the first capacitor electrode CE1 and the second capacitor electrode CE2, the second gate insulating layer 113 may serve as a dielectric layer of the storage capacitor Cst.

The second capacitor electrode CE2 may include an opening SOP. The opening SOP is formed by removing a portion of the second capacitor electrode CE2. The second capacitor electrode CE2 may have a closed shape.

The second capacitor electrodes CE2 of adjacent pixels PX may be connected to each other by a bridge 141. The bridge 141 is a portion protruding in the first direction DR1 from the second capacitor electrode CE2 and may be integrally formed as one body with the second capacitor electrode CE2.

A connection electrode 187 (illustrated in FIG. 11) of the source-drain layer SDL is electrically connected to the third semiconductor layer and the fourth semiconductor layer of the second active layer AL2 through the contact hole 41 and electrically connected to the first bottom metal layer BML1 of the bottom metal layer BML disposed below the source-drain layer SDL through the contact hole 67. In addition, the first capacitor electrode CE1 of the first gate layer GL1 is electrically connected to the first bottom metal layer BML1 disposed therebelow through the contact hole 31, and consequently, electrically connected to the third semiconductor layer and the fourth semiconductor layer of the second active layer AL2. The second capacitor electrode CE2 may be electrically connected to the power voltage line 183 (PL) of the source-drain layer SDL disposed over the second gate layer GL2 through the contact hole 66. The power voltage line 183 may extend in the second direction DR2. The second capacitor electrode CE2 may extend in the first direction DR1 and be configured to transfer the power voltage ELVDD in the first direction DR1. Accordingly, the plurality of power voltage lines 183 and the plurality of second capacitor electrodes CE2 in the display area DA may have a mesh structure in a plan view.

Referring to FIG. 4, the second transistor T2 includes a second semiconductor layer and a second gate electrode G2. The second semiconductor layer includes a second active region A2, a second source region S2, and a second drain region D2, the second source region S2 and the second drain region D2 respectively being on two opposite sides of the second active region A2. The second source region S2 may be electrically connected to a data line 181 of the source-drain layer SDL disposed over the first active layer AL1 through the contact hole 61. The second drain region D2 may be electrically connected to the first source region S1 of the first transistor T1. In this case, because the third capacitor electrode CE3 of the bias capacitor Cbia is formed by a semiconductor layer disposed on the same layer as the first semiconductor layer or the second semiconductor layer as illustrated in FIG. 6, the second drain region D2 may be electrically connected to the first source region S1 of the first transistor T1 through the third capacitor electrode CE3. FIG. 6 illustrates that the third capacitor electrode CE3, the first semiconductor layer, and the second semiconductor layer are integrally formed as a single body. The second gate electrode G2 is a portion of the scan line 134 overlapping the second semiconductor layer.

The fifth transistor T5 includes a fifth semiconductor layer and a fifth gate electrode G5. The fifth semiconductor layer includes a fifth active region A5, a fifth source region S5, and a fifth drain region D5, the fifth source region S5 and the fifth drain region D5 respectively being on two opposite sides of the fifth active region A5. The fifth source region S5 may be electrically connected to the power voltage line 183 of the source-drain layer SDL through a connection electrode 147 of the second gate layer GL2, a third bottom metal layer BML3 of the bottom metal layer BML, and the second capacitor electrode CE2 of the second gate layer GL2, and the fifth drain region D5 may be connected to the first source region S1. That is, the third bottom metal layer BML3 may electrically connect the fifth transistor T5 to the second capacitor electrode CE2, and consequently, electrically connect the fifth transistor T5 to the power voltage line 183. The fifth gate electrode G5 may be a portion of the bottom emission control line 136 overlapping the first active layer AL1.

The sixth transistor T6 includes a sixth semiconductor layer and a sixth gate electrode G6. The sixth semiconductor layer includes a sixth active region A6, a sixth source region S6, and a sixth drain region D6, the sixth source region S6 and the sixth drain region D6 respectively being on two opposite sides of the sixth active region A6. The sixth source region S6 is connected to the first drain region D1. The sixth drain region D6 may be electrically connected to a seventh semiconductor layer of the second active layer AL2 through the connection electrode 167 of the third gate layer GL3, the second bottom metal layer BML2 of the bottom metal layer BML, and a connection electrode 161 of the third gate layer GL3. That is, the second bottom metal layer BML2 may electrically connect the sixth transistor T6 to the seventh transistor T7. In addition, the sixth drain region D6 may be electrically connected to a pixel electrode 310 of the organic light-emitting diode OLED through the connection electrode 167 of the third gate layer GL3 and a connection electrode 185 of the source-drain layer SDL, and consequently, electrically connected to the pixel electrode 310. The sixth gate electrode G6 may be a portion of the bottom emission control line 136 overlapping the first active layer AL1. The connection electrode 161 may be referred to as a first connection electrode, and the connection electrode 167 may be referred to as a second connection electrode.

As described above, the second active layer AL2 may include an oxide semiconductor. In addition, the third transistor T3, the fourth transistor T4, and the seventh transistor T7 may include portions of the second active layer AL2 as elements as illustrated in FIG. 9.

The second active layer AL2 including an oxide semiconductor may include an active region, a source region, and a drain region, the source region and the drain region respectively being on two opposite sides of the active region. As an example, the source region and the drain region may be regions in which carrier concentration has been increased by performing, on an oxide semiconductor, plasma treatment that uses a hydrogen (H)-based gas, a fluorine (F)-based gas, or a combination thereof. The source region and the drain region may respectively correspond to a source electrode and a drain electrode. Hereinafter, a source region and a drain region are used instead of a source electrode and a drain electrode.

The third transistor T3 includes a third semiconductor layer and a third gate electrode G3, the third semiconductor layer including an oxide semiconductor. The third semiconductor layer includes a third active layer A3, a third source region S3, and a third drain region D3, the third source region S3 and the third drain region D3 respectively being on two opposite sides of the third active layer A3. Because the third source region S3 is connected to the first gate electrode G1 of the first gate layer GL1 through the connection electrode 187 of the source-drain layer SDL and the first bottom metal layer BML1 of the bottom metal layer BML, the third source region S3 may be connected to the first gate electrode G1 consequently. In addition, the third source region S3 may be connected to a fourth drain region D4 disposed on the same layer. FIG. 9 illustrates that the third source region S3 and the fourth drain region D4 are integrally formed as a single body. That is, a fourth semiconductor layer including the fourth drain region D4 is electrically connected to the first transistor T1 including the first gate electrode G1 through the first bottom metal layer BML1.

The third drain region D3 may be electrically connected to the first semiconductor layer of the first transistor T1 and the sixth semiconductor layer of the sixth transistor T6 through the connection electrode 189 of the source-drain layer SDL. The third gate electrode G3 may include the portion G3b of the top compensation control line 165 crossing the second active layer AL2, and the portion G3a of the bottom compensation control line 145 crossing the second active layer AL2. That is, the third gate electrode G3 may have a double gate structure including control electrodes respectively above and below the semiconductor layer.

The fourth transistor T4 includes a fourth semiconductor layer and the fourth gate electrode G4, the fourth semiconductor layer including an oxide semiconductor. The fourth semiconductor layer includes a fourth active layer A4, a fourth source region S4, and a fourth drain region D4, the fourth source region S4 and the fourth drain region D4 respectively being on two opposite sides of the fourth active region A4. The fourth source region S4 may be electrically connected to the first initialization voltage line 137 through a connection electrode 168 of the third gate layer GL3. The fourth drain region D4 may be electrically connected to the first gate electrode G1 through the connection electrode 187 of the source-drain layer SDL and the first bottom metal layer BML1 of the bottom metal layer BML. The fourth gate electrode G4 may include a portion G4b of the top initialization line 163 crossing the second active layer AL2 and a portion G4a of the bottom initialization line 143 crossing the second active layer AL2. That is, the fourth gate electrode G4 may have a double gate structure including control electrodes respectively above and below the semiconductor layer.

The seventh transistor T7 includes a seventh semiconductor layer and a seventh gate electrode G7. The seventh semiconductor layer includes a seventh active region A7, a seventh source region S7, and a seventh drain region D7, the seventh source region S7 and the seventh drain region D7 respectively being on two opposite sides of the seventh active region A7. The seventh source region S7 may be electrically connected to the second initialization voltage line 169 of the third gate layer GL3 disposed over the second active layer AL2 through the contact hole 43. The seventh drain region D7 may be electrically connected to the sixth drain region D6 through the connection electrode 161 of the third gate layer GL3, the second bottom metal layer BML2 of the bottom metal layer BML, and the connection electrode 167 of the third gate layer GL3. The seventh gate region G7 may include a portion G7b of the top emission control line 166 overlapping the second active layer AL2, and a portion G1a of the bottom emission control line 136 overlapping the second active layer AL2. That is, the seventh gate electrode G7 may have a double gate structure including control electrodes respectively above and below the semiconductor layer.

The bias capacitor Cbia includes the third capacitor electrode CE3 and the fourth capacitor electrode CE4. The third capacitor electrode CE3 may be formed in the first active layer AL1 as illustrated in FIG. 6. Specifically, the third capacitor electrode CE3 may be formed by doping a polycrystalline silicon layer with the above-described impurities. The third capacitor electrode CE3 may be one body with the first source region S1 of the first transistor T1 and the fifth drain region D5 of the fifth transistor T5. The fourth capacitor electrode CE4 overlaps the third capacitor electrode CE3. As illustrated in FIG. 10, the fourth capacitor electrode CE4 may be a portion of the top emission control line 166 of the emission control line EL. That is, the top emission control line 166 and the fourth capacitor electrode CE4 may be integrally formed as one body. Because the first gate insulating layer 112 to the fourth gate insulating layer 115 are disposed between the third capacitor electrode CE3 and the fourth capacitor electrode CE4, the gate insulating layers may serve as a dielectric layer of the bias capacitor Cbia. As illustrated in FIG. 10, two adjacent pixels on an i-th row may share the fourth capacitor electrode CE4.

As illustrated in FIG. 12, the pixel-defining layer 119 may be disposed on the planarization layer 118. The pixel-defining layer 119 defines a pixel by including an opening that corresponds to each of sub-pixels, that is, an opening that exposes at least the central portion of the pixel electrode 310. In addition, the pixel-defining layer 119 prevents an arc, etc. from occurring at the edges of the pixel electrode 310 by increasing a distance between the edges of the pixel electrode 310 and the opposite electrode 330 over the pixel electrode 310. The pixel-defining layer 119 may include, for example, an organic material such as polyimide, or HMDSO.

The intermediate layer 320 of the organic light-emitting diode OLED may include a low-molecular weight material or a polymer material. In the case where the intermediate layer 320 includes a low molecular weight material, the intermediate layer 320 may have a structure in which a hole injection layer (HIL), a hole transport layer (HTL), an emission layer (EML), an electron transport layer (ETL), an electron injection layer (EIL), etc. are stacked in a single or composite configuration. These layers may be formed by vacuum deposition. In the case where the intermediate layer 320 includes a polymer material, the intermediate layer 320 may have a structure including an HTL and an EML. In this case, the HTL may include poly (3,4-ethylenedioxythiophene) (PEDOT), and the EML may include a polymer material such as a poly(p-phenylene vinylene (PPV)-based material and a polyfluorene-based material. The intermediate layer 320 may be formed through screen printing, inkjet printing, laser induced thermal imaging (LITI), etc. The intermediate layer 320 is not limited thereto and may have various structures. In addition, the intermediate layer 320 may include one body over a plurality of pixel electrodes 310, or include a layer patterned to correspond to each of the plurality of pixel electrodes 310.

The opposite electrode 330 may cover the display area DA. That is, the opposite electrode 330 may be integrally formed as one body over a plurality of organic light-emitting diodes OLED to correspond to the plurality of pixel electrodes 310. The opposite electrode 330 may cover the display area DA and extend to a peripheral area outside the display area DA.

The display apparatus according to an embodiment includes the bottom metal layer BML to protect the second active layer AL2 including an oxide semiconductor from external light, etc. Accordingly, the display apparatus displaying a high-quality image may be implemented. In addition, various elements of the display apparatus may be electrically connected when implemented by using the first bottom metal layer BML1 and the third bottom metal layer BML3 of the bottom metal layer BML. Through this, a layer structure of the display apparatus having a multi-layered structure may be simplified.

Figure 13:
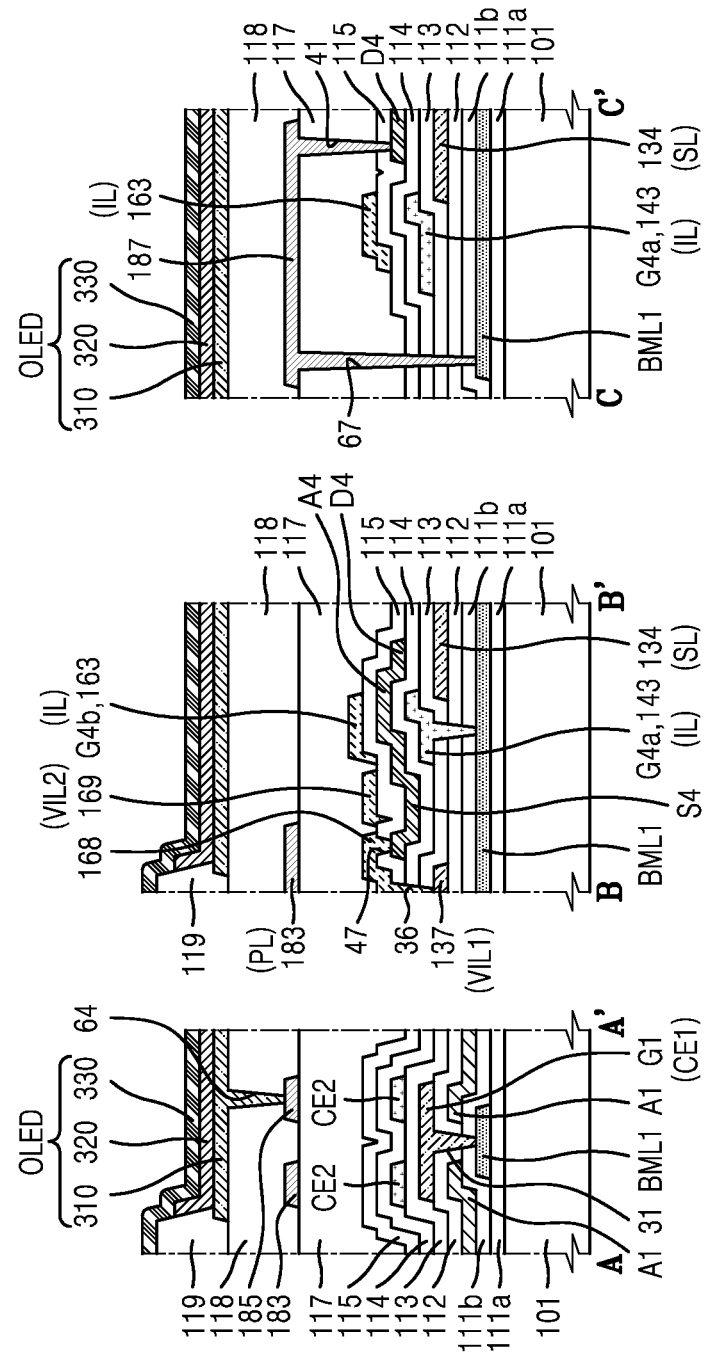
FIG. 13 is a cross-sectional view illustrating a portion of a display apparatus according to an embodiment.

FIG. 13 is a cross-sectional view illustrating a portion of a display apparatus according to another embodiment. The display apparatus according to an embodiment is different from the display apparatus described with reference to FIG. 12, etc. in that the portion G4a, which is a part of the bottom initialization line 143 of the second gate layer GL2 and is the 4-1$^{st}$ gate electrode of the fourth transistor T4, is connected to the first bottom metal layer BML1 of the bottom metal layer BML through a contact hole defined in the second buffer layer 111b, the first gate insulating layer 112, and the second gate insulating layer 113. In this case, a portion of the first bottom metal layer BML1 connected to a 4-1$^{st}$ gate electrode may be electrically insulated from a portion of the first bottom metal layer BML1 connected to the first gate electrode G1. Through this configuration, voltage stability of the 4-1$^{st}$ gate electrode may be raised even more.

The display apparatus illustrated in FIG. 13 may be manufactured through a first mask process of patterning the bottom metal layer BML illustrated in FIG. 5, a second mask process of patterning the first active layer AL1 illustrated in FIG. 6, a third mask process of forming a contact hole in the first gate insulating layer 112, etc., a fourth mask process of patterning the first gate layer GL1 illustrated in FIG. 7, a fifth mask process of patterning the second gate layer GL2 illustrated in FIG. 8, a sixth mask process of patterning the second active layer AL2 illustrated in FIG. 9, a seventh mask process of forming a contact hole in the fourth gate insulating layer 115, etc., an eighth mask process of patterning the third gate layer GL3 illustrated in FIG. 10, a ninth mask process of forming a contact hole in the interlayer insulating layer 117, a tenth mask process of patterning the source-drain layer SDL illustrated in FIG. 11, an eleventh mask process of forming a contact hole in the planarization layer 118, a twelfth mask process of patterning the pixel electrode 310, and a thirteenth mask process of patterning the pixel-defining layer 119.

As described above, in the display apparatus according to an embodiment, the first active layer AL1 including a silicon semiconductor and the second active layer AL2 including an oxide semiconductor are used, and the bottom metal layer BML is formed not only to protect the second active layer AL2 but also to be used as the connection electrode or the wiring, etc. Therefore, the display apparatus may be manufactured through only 13 mask processes.

Figure 14:
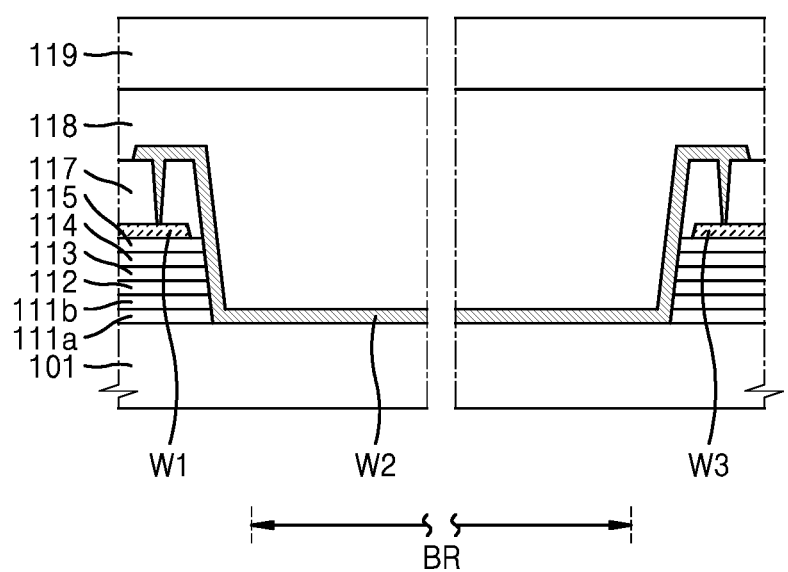
FIG. 14 is a cross-sectional view illustrating a portion of a display apparatus according to an embodiment.
Figure 15:
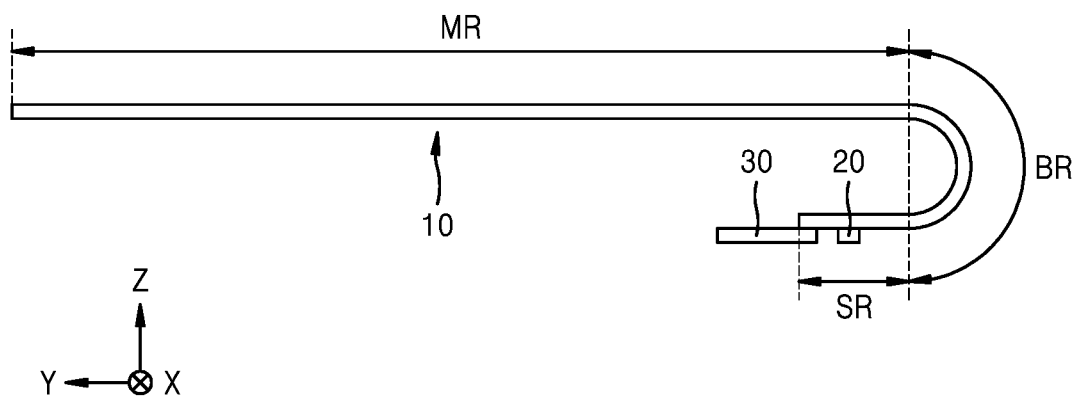
FIG. 15 is a conceptual lateral view of a portion of the display apparatus of FIG. 14.

FIG. 14 is a cross-sectional view illustrating a portion of a display apparatus according to another embodiment, and FIG. 15 is a lateral conceptual view of a portion of the display apparatus of FIG. 14.

As illustrated in FIG. 15, a display panel 10 of the display apparatus may include a main region MR, a bendable region BR outside the main region MR, and a sub-region SR positioned opposite the main region MR around the bendable region BR. As illustrated in FIG. 15, the display panel 10 is bent in the bendable region BR, and in a view in a z-axis direction perpendicular to an XY plane, at least a portion of the sub-region SR may overlap the main region MR. A driving chip 20 may be arranged in the sub-region SR of the display panel 10. The driving chip 20 may include an integrated circuit that drives the display panel 10. Though the integrated circuit may be a data driving integrated circuit that generates a data signal, the embodiment is not limited thereto.

The driving chip 20 may be mounted in the sub-region SR of the display panel 10. Though the driving chip 20 is mounted on the same plane as a display surface of the display area DA, because the display panel 10 is bent in the bendable region BR as described above, the driving chip 20 may be disposed over the backside of the main region MR. A printed circuit board 30, etc. may be attached to an end portion of the sub-region SR of the display panel 10. The printed circuit board 30, etc. may be electrically connected to the driving chip 20, etc. through a pad (not illustrated) on the substrate 101.

As illustrated in FIG. 15, because the display panel 10 is bent in the bendable region BR, when the display apparatus is viewed in a front side ((−) Z-direction), a non-display area may not be viewed or a viewed area may be reduced even when the non-display area is viewed. FIG. 14 is a cross-sectional view of a portion of the bendable region BR of the display apparatus. As illustrated in FIG. 14, at least a portion of the first buffer layer 111a, the second buffer layer 111b, the first gate insulating layer 112 to the fourth gate insulating layer 115, and the interlayer insulating layer 117 may be removed from the bendable region BR. Because the first buffer layer 111a, the second buffer layer 111b, the first gate insulating layer 112 to the fourth gate insulating layer 115, and the interlayer insulating layer 117 include an inorganic material, when there are these layers inside the bendable region BR, a crack may occur inside these layers while the substrate 101, etc. are bent. Therefore, as illustrated in FIG. 14, at least a portion of the first buffer layer 111a, the second buffer layer 111b, the first gate insulating layer 112 to the fourth gate insulating layer 115, and the interlayer insulating layer 117 may be removed from the bendable region BR.

In addition, because the main region MR may be electrically connected to the sub-region SR, a second wiring W2 may pass across the bendable region BR as illustrated in FIG. 14. The second wiring W2 may include the same material as that of the source-drain layer SDL. In addition, the second wiring W2 may be electrically connected to a first wiring W1 and/or a third wiring W3 outside the bendable region BR. The first wiring W1 and/or the third wiring W3 may include the same material as that of the third gate layer GL3. That is, the first wiring W1 and/or the third wiring W3 may be wirings in the third gate layer GL3.

In the bendable region BR, the planarization layer 118 may be disposed on the second wiring W2. Because the planarization layer 118 includes an organic material, the size of stress occurring inside the planarization layer 118 may not be large despite bending. Because the pixel-defining layer 119 includes an organic material, the pixel-defining layer 119 may be disposed on the planarization layer 118 inside the bendable region BR.

Figure 16:
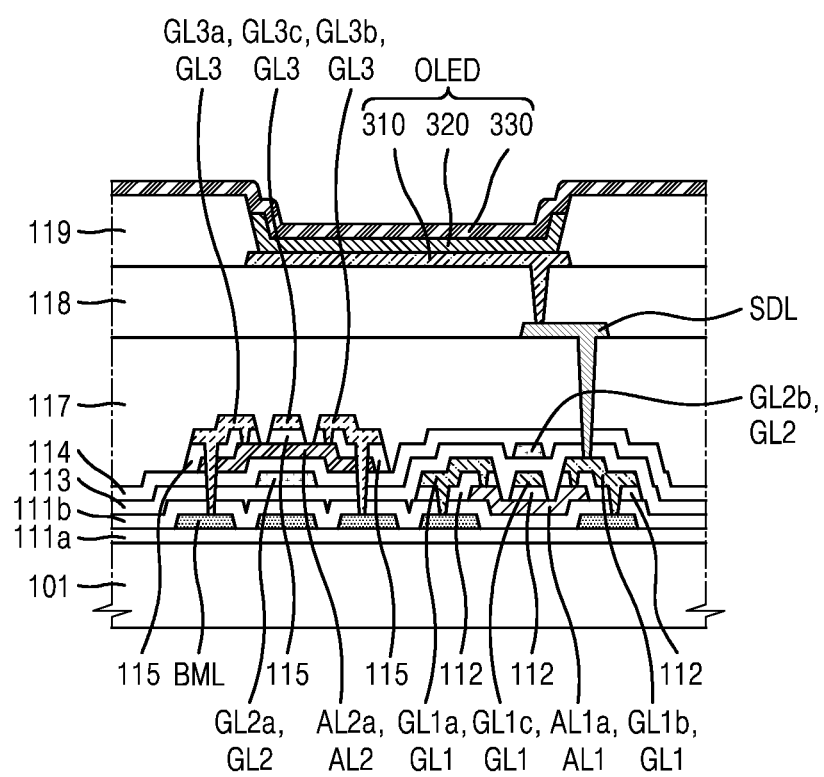
FIG. 16 is a cross-sectional view illustrating a portion of a display apparatus according to an embodiment.

FIG. 16 is a cross-sectional view illustrating a portion of a display apparatus according to another embodiment. The display apparatus according to an embodiment is different from the display apparatus according to the previous embodiment in that the first gate layer GL1 includes a first source electrode GL1a and a first drain electrode GL1b.

That is, in the display apparatus according to an embodiment, the second buffer layer 111b covers the bottom metal layer BML on the first buffer layer 111a, and a semiconductor layer AL1a of the first active layer AL1 is disposed on the second buffer layer 111b. In addition, the first gate insulating layer 112 is disposed on the semiconductor layer AL1a, and the first source electrode GL1a, the first drain electrode GL1b, and a gate electrode GL1c of the first gate layer GL1 are disposed on the first gate insulating layer 112. When implemented, while the first source electrode GL1a, the first drain electrode GL1b, and the gate electrode GL1c are patterned during the manufacturing process, the first source electrode GL1a, the first drain electrode GL1b, and the gate electrode GL1c may be simultaneously patterned with the first gate insulating layer 112 therebelow. Accordingly, the edge of each of the first source electrode GL1a, the first drain electrode GL1b, and the gate electrode GL1c may coincide with the edge of the first gate insulating layer 112 disposed therebelow.

The first source electrode GL1a and the first drain electrode GL1b may contact the semiconductor layer AL1a to allow an electric signal to be transferred between the first source electrode GL1a and the first drain electrode GL1b according to an electric signal applied to the gate electrode GL1c. At least one of the first source electrode GL1a and the first drain electrode GL1b may contact the first wiring of the bottom metal layer BML. It is illustrated in FIG. 16 that both the first source electrode GL1a and the first drain electrode GL1b contact a corresponding wiring.

In the display apparatus according to an embodiment, the bottom metal layer BML may protect the thin-film transistor disposed over the bottom metal layer BML, and simultaneously, serve as a wiring. In the display apparatus according to an embodiment, the structure of metal layers on the first active layer AL1 may be simplified.

The second gate layer GL2 may be disposed between the second gate insulating layer 113 and the third gate insulating layer 114, the second gate insulating layer 113 covering the first gate layer GL1. FIG. 16 illustrates that the second gate layer GL2 includes a first portion GL2b and a second portion GL2a. The first portion GL2b corresponds to the gate electrode GL1c disposed below the second gate layer GL2, and the second portion GL2a corresponds to a gate electrode GL3c disposed over the second gate layer GL2 described below. In addition, a semiconductor layer AL2a of the second active layer AL2 is disposed on the third gate insulating layer 114. The fourth gate insulating layer 115 is disposed on the semiconductor layer AL2a. A second source electrode GL3a, a second drain electrode GL3b, and the gate electrode GL3c of the third gate layer GL3 are disposed on the fourth gate insulating layer 115.

When implemented, while the second source electrode GL3a, the second drain electrode GL3b, and the gate electrode GL3c are patterned during the manufacturing process, the second source electrode GL3a, the second drain electrode GL3b, and the gate electrode GL3c may be simultaneously patterned with the fourth gate insulating layer 115 therebelow. Accordingly, the edge of each of the second source electrode GL3a, the second drain electrode GL3b, and the gate electrode GL3c may coincide with the edge of the fourth gate insulating layer 115 disposed therebelow.

The second source electrode GL3a and the second drain electrode GL3b may contact the semiconductor layer AL2a to allow an electric signal to be transferred between the second source electrode GL3a and the second drain electrode GL3b according to an electric signal applied to the gate electrode GL3c. In addition, at least one of the second source electrode GL3a and the second drain electrode GL3b may contact a second wiring of the bottom metal layer BML. It is illustrated in FIG. 16 that both the second source electrode GL3a and the second drain electrode GL3b contact a corresponding wiring.

In the display apparatus according to an embodiment, the bottom metal layer BML may protect the thin-film transistor disposed over the bottom metal layer BML, and simultaneously, serve as a wiring. In the display apparatus according to an embodiment, the structure of metal layers on the second active layer AL2 may be simplified.

The source-drain layer SDL disposed on the interlayer insulating layer 117 covering the third gate layer GL3 may be electrically connected to the thin-film transistor disposed below the source-drain layer SDL. It is illustrated in FIG. 16 that the source-drain layer SDL is connected to the first drain electrode GL1b. Because the pixel electrode 310 on the planarization layer 118 covering the source-drain layer SDL may be electrically connected to the source-drain layer SDL, the pixel electrode 310 may receive an electric signal from the thin-film transistor disposed below the source-drain layer SDL.

Figure 17:
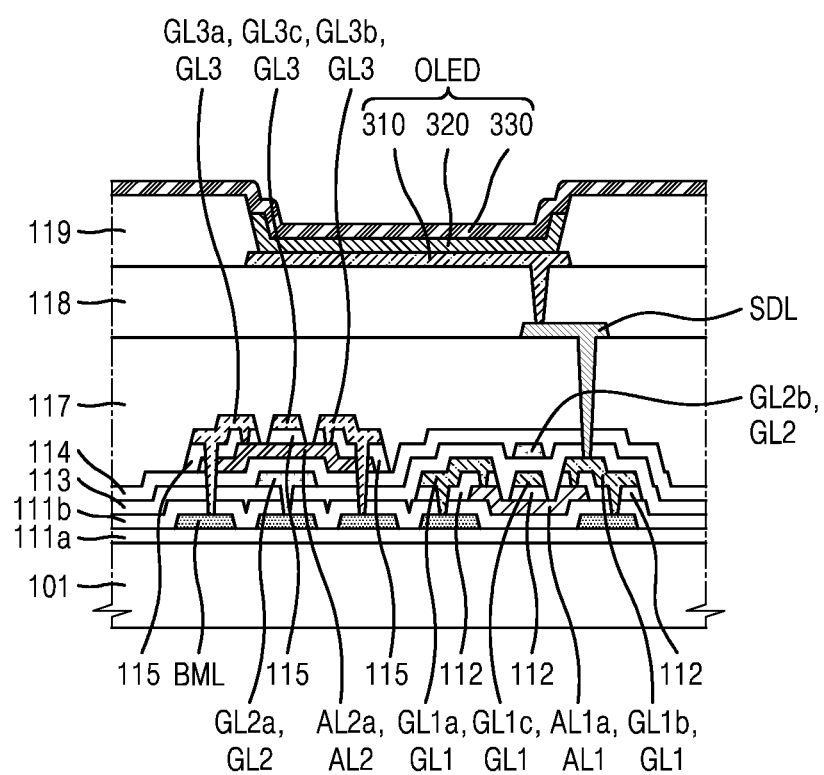
FIG. 17 is a cross-sectional view illustrating a portion of a display apparatus according to an embodiment.

FIG. 17 is a cross-sectional view illustrating a portion of a display apparatus according to another embodiment. The display apparatus according to an embodiment is different from the display apparatus described with reference to FIG. 16 in that the second portion GL2a of the second gate layer GL2 is connected to the bottom metal layer BML through a contact hole defined in an insulating layer therebelow. The bottom metal layer BML connected to the second portion GL2a is electrically connected to the gate electrode GL3c such that the second portion GL2a of the second gate layer GL2 and the gate electrode GL3c over the second portion GL2a operate as a dual gate electrode.

Figure 18:
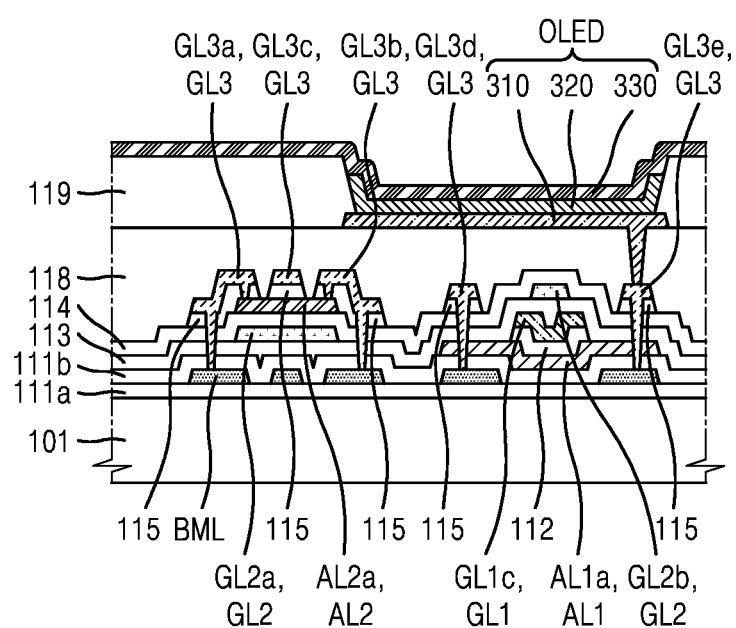
FIG. 18 is a cross-sectional view illustrating a portion of a display apparatus according to an embodiment.

FIG. 18 is a cross-sectional view illustrating a portion of a display apparatus according to another embodiment.

In the display apparatus according to an embodiment, the second buffer layer 111b covers the bottom metal layer BML on the first buffer layer 111a, and the semiconductor layer AL1a of the first active layer AL1 is disposed on the second buffer layer 111b. In addition, the first gate insulating layer 112 is disposed on the semiconductor layer AL1a in the OLED region, and the gate electrode GL1c of the first gate layer GL1 is disposed on the first gate insulating layer 112. When implemented, while the gate electrode GL1c is patterned during the manufacturing process, the first gate insulating layer 112 below the gate electrode GL1c may be simultaneously patterned as the gate electrode GL1c. Accordingly, the edge of the gate electrode GL1c may coincide with the edge of the first gate insulating layer 112 below the gate electrode GL1c.

In addition, the second gate layer GL2 may be disposed between the second gate insulating layer 113 covering the first gate layer GL1, and the third gate insulating layer 114. FIG. 18 illustrates that the second gate layer GL2 includes the first portion GL2b and the second portion GL2a. The first portion GL2b corresponds to the gate electrode GL1c below the second gate layer GL2, and the second portion GL2a corresponds to the gate electrode GL3c over the second gate layer GL2. In addition, the semiconductor layer AL2a of the second active layer AL2 is disposed on the third gate insulating layer 114. The fourth gate insulating layer 115 is disposed on the semiconductor layer AL2a, and a first source electrode GL3d, a first drain electrode GL3e, the second source electrode GL3a, the second drain electrode GL3b, and the gate electrode GL3c of the third gate layer GL3 are disposed on the fourth gate insulating layer 115.

When implemented, while the first source electrode GL3d, the first drain electrode GL3e, the second source electrode GL3a, the second drain electrode GL3b, and the gate electrode GL3c are patterned during the manufacturing process, the fourth gate insulating layer 115 below them may be simultaneously patterned with the first source electrode GL3d, the first drain electrode GL3e, the second source electrode GL3a, the second drain electrode GL3b, and the gate electrode GL3c. Accordingly, the edge of each of the first source electrode GL3d, the first drain electrode GL3e, the second source electrode GL3a, the second drain electrode GL3b, and the gate electrode GL3c may coincide with the edge of the fourth gate insulating layer 115 disposed therebelow.

The first source electrode GL3d and the first drain electrode GL3e may contact the semiconductor layer AL1a to allow an electric signal to be transferred between the first source electrode GL3d and the first drain electrode GL3e according to an electric signal applied to the gate electrode GL1c. The second source electrode GL3a and the second drain electrode GL3b may contact the semiconductor layer AL2a to allow an electric signal to be transferred between the second source electrode GL3a and the second drain electrode GL3b according to an electric signal applied to the gate electrode GL3c.

At least one of the first source electrode GL3d and the first drain electrode GL3e may contact the first wiring of the bottom metal layer BML. It is illustrated in FIG. 18 that both the first source electrode GL3d and the first drain electrode GL3e contact a corresponding wiring. In addition, at least one of the second source electrode GL3a and the second drain electrode GL3b may contact the second wiring of the bottom metal layer BML. It is illustrated in FIG. 18 that both the second source electrode GL3a and the second drain electrode GL3b contact a corresponding wiring.

In the display apparatus according to an embodiment, the bottom metal layer BML may protect the thin-film transistor disposed over the bottom metal layer BML, and simultaneously, serve as a wiring. In the display apparatus according to an embodiment, the structure of metal layers on the first active layer AL1 and/or the second active layer AL2 may be simplified.

Because the pixel electrode 310 disposed on the planarization layer 118 covering the third gate layer GL3 is connected to, for example, the first drain electrode GL3e, the pixel electrode 310 may receive an electric signal from a thin-film transistor therebelow.

Figure 19:
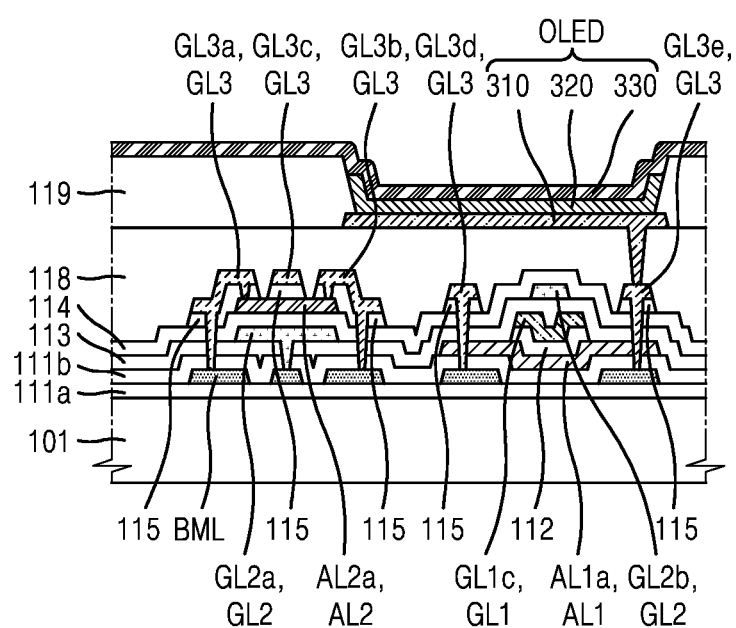
FIG. 19 is a cross-sectional view illustrating a portion of a display apparatus according to an embodiment.

FIG. 19 is a cross-sectional view illustrating a portion of a display apparatus according to another embodiment. The display apparatus according to an embodiment is different from the display apparatus described with reference to FIG. 18 in that the second portion GL2a of the second gate layer GL2 is connected to the bottom metal layer BML through a contact hole defined in an insulating layer therebelow. The bottom metal layer BML to which the second portion GL2a is connected is electrically connected to the gate electrode GL3c such that the second portion GL2a of the second gate layer GL2 and the gate electrode GL3c over the second portion GL2a operate as a dual gate electrode.

Figure 20:
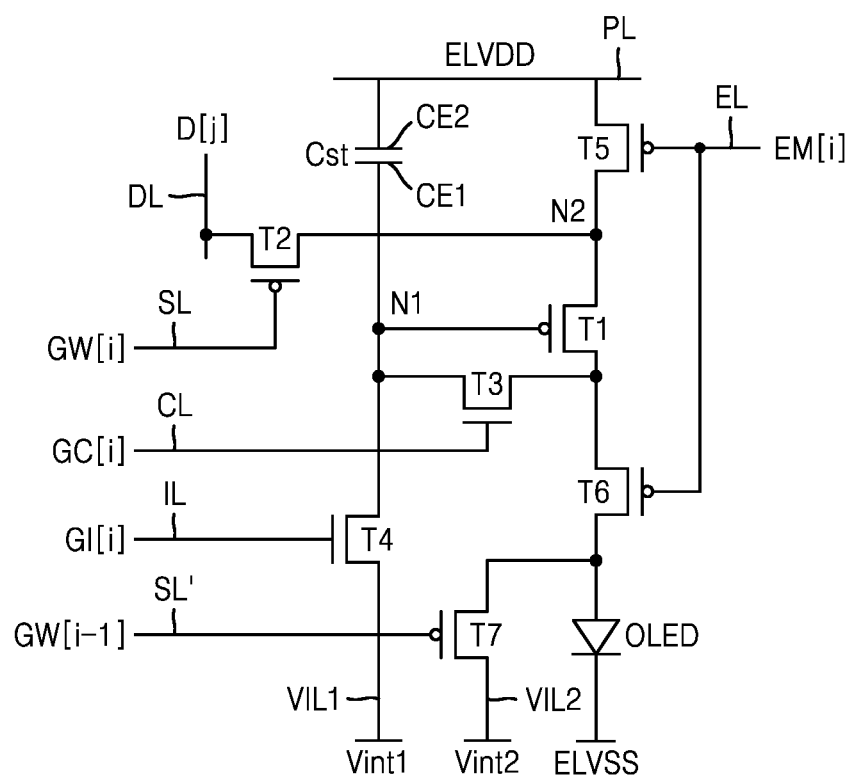
FIG. 20 is an equivalent circuit diagram illustrating a pixel of a display apparatus according to an embodiment.

FIG. 20 is an equivalent circuit diagram illustrating a pixel of a display apparatus according to another embodiment. The equivalent circuit diagram of FIG. 20 is different from the equivalent circuit diagram of FIG. 2. As described above, an embodiment is applicable to the display apparatus including pixels corresponding to various equivalent circuits.

Referring to FIG. 20, a pixel PX includes the first transistor T1 to the seventh transistor T7, the storage capacitor Cst, the organic light-emitting diode OLED, the first initialization voltage line VIL1, the second initialization voltage line VIL2, the power voltage line PL, and signal lines. The signal lines may include the data line DL, the scan line SL, a previous scan line SL', the initialization line IL, the compensation control line CL, and the emission control line EL. At least one of the signal lines, the first initialization voltage line VIL1, the second initialization voltage line VIL2, and/or the power voltage line PL may be shared by adjacent pixels.

The equivalent circuit according to an embodiment is different from the equivalent circuit described with reference to FIG. 2 in that the equivalent circuit according to an embodiment does not have the bias capacitor Cbia connected between the second node N2 and the emission control line EL, the seventh transistor T7, which is the second initialization transistor, is implemented as a PMOS-FET instead of an NMOS-FET, and the gate electrode of the seventh transistor T7 is connected to the previous scan line SL', not the emission control line EL, and turned on according to a previous scan signal GW[i−1] transferred through the previous scan line SL' to transfer the second initialization voltage Vint2 from the second initialization voltage line VIL2, thereby initializing the organic light-emitting diode OLED. In some embodiments, the seventh transistor T7 may be omitted.

Content described in the embodiment with reference to FIG. 2 is applicable to other elements, and thus, descriptions thereof are omitted for convenience of description.

Figure 21:
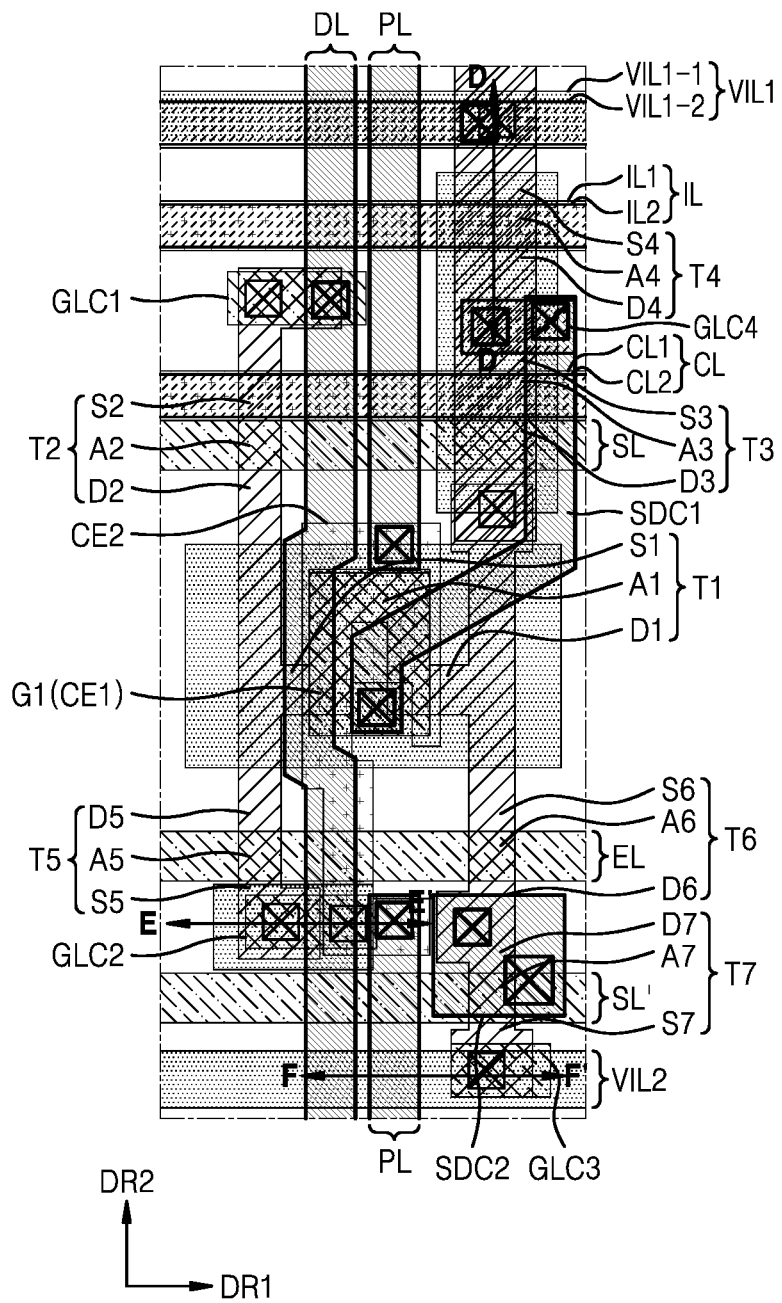
FIG. 21 is a layout view showing positions of transistors and capacitors of a pixel in FIG. 20.

FIG. 21 is a layout view illustrating positions of transistors and capacitors of a pixel having the equivalent circuit in FIG. 20. FIG. 20 illustrates one pixel.

Figure 26:
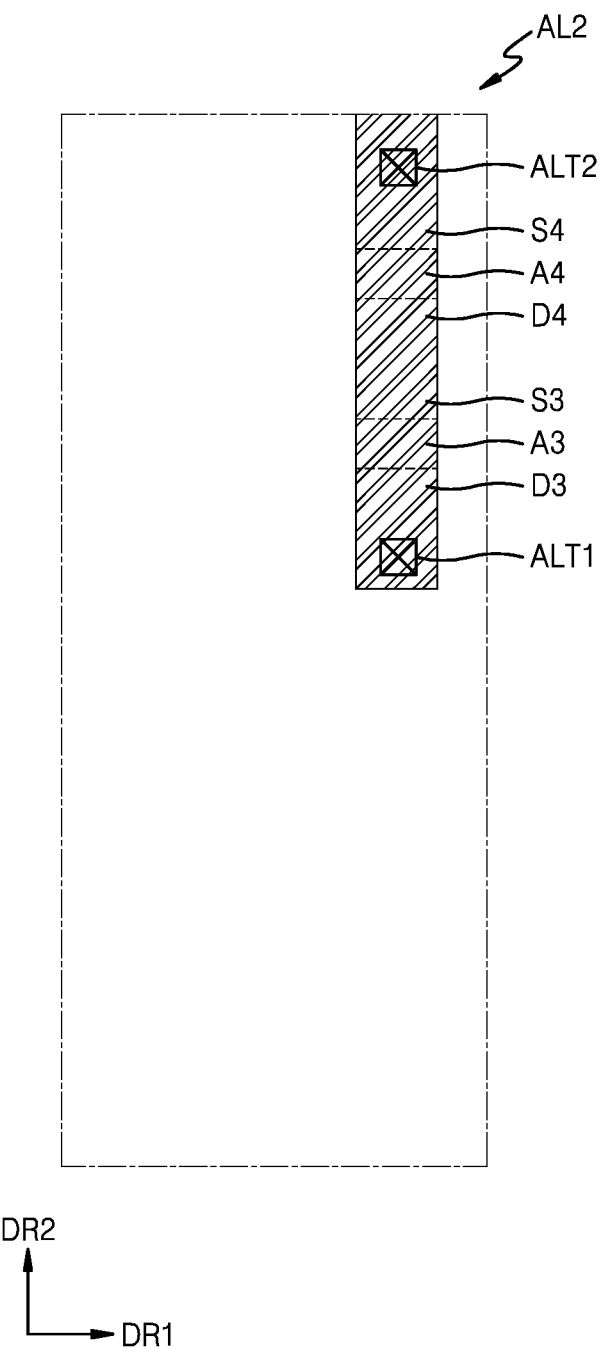
Figure 27:
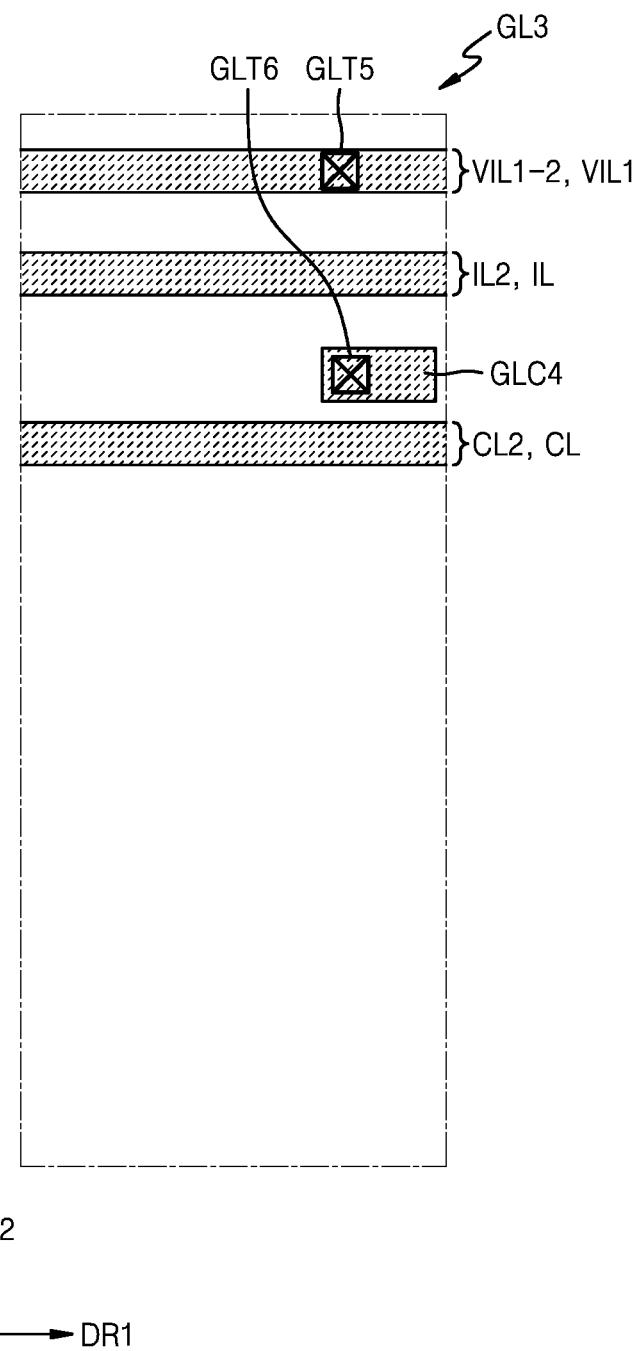
Figure 28:
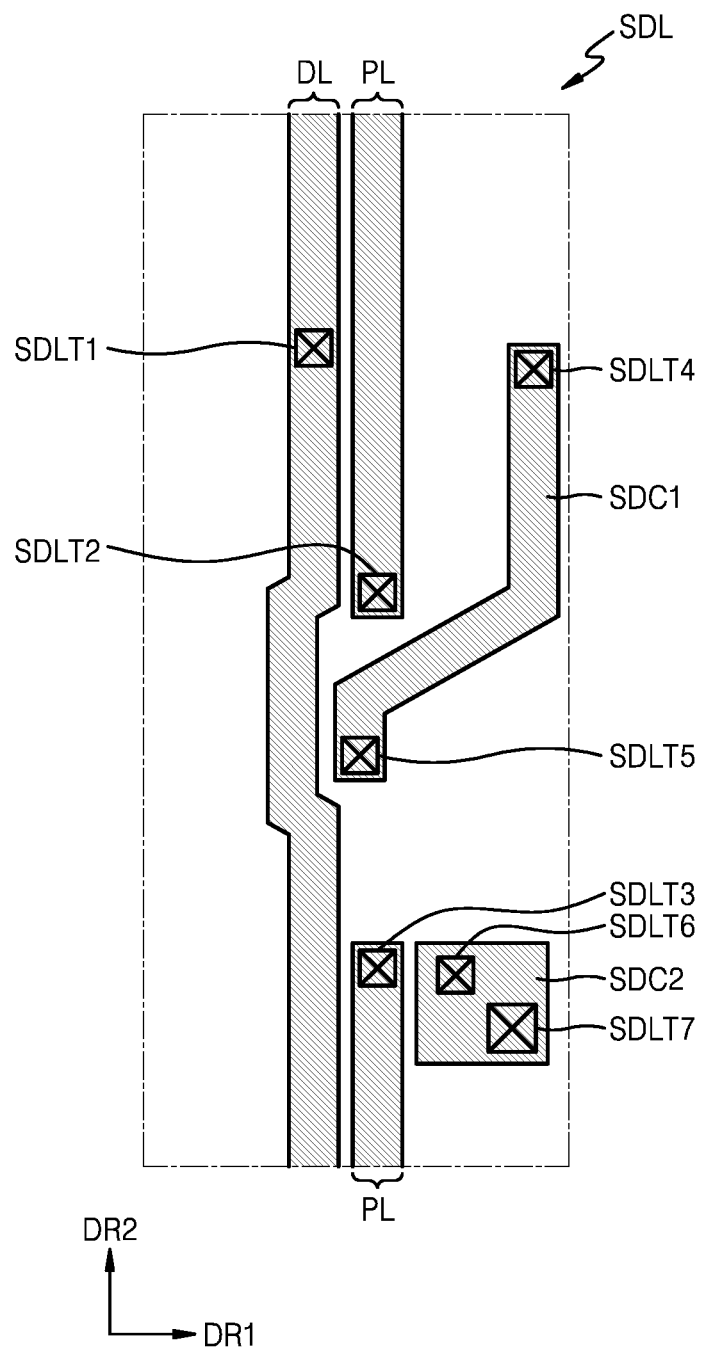
Figure 29:
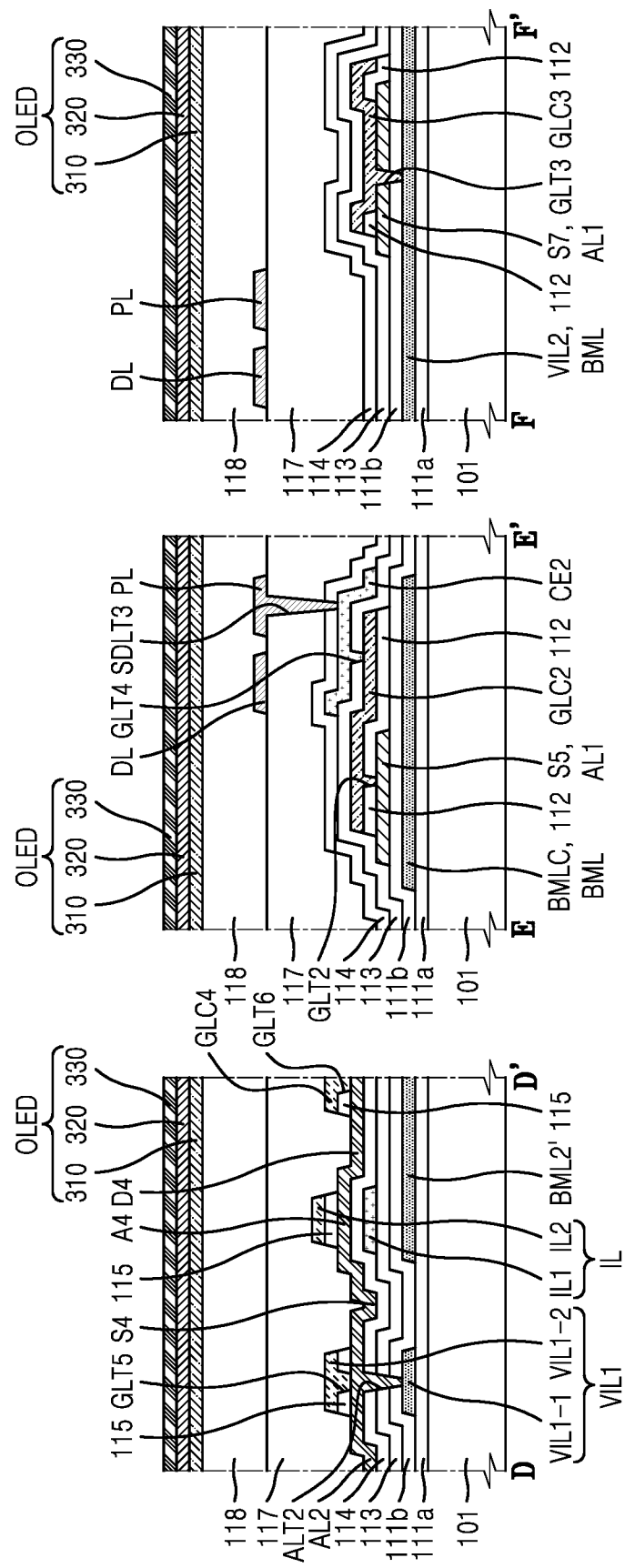
FIG. 29 is a cross-sectional view of the display apparatus, taken along lines D-D', E-E', and F-F' of FIG. 21.

FIGS. 22 to 28 are layout views of elements such as the transistors and the capacitors of FIG. 21 for each layer. FIG. 29 is a cross-sectional view of the display apparatus, taken along lines D-D', E-E', and F-F' of FIG. 21 according to another embodiment. As sequentially illustrated in FIGS. 22 to 28, the bottom metal layer BML of FIG. 22, the first active layer AL1 of FIG. 23, the first gate layer GL1 of FIG. 24, the second gate layer GL2 of FIG. 25, the second active layer AL2 of FIG. 26, the third gate layer GL3 of FIG. 27, and the source-drain layer SDL of FIG. 28 are disposed in a direction away from the substrate from near the substrate.

Insulating layers are disposed between these layers. Specifically, the first buffer layer 111a may be disposed between the substrate and the bottom metal layer BML of FIG. 22, the second buffer layer 111b may be disposed between the bottom metal layer BML of FIG. 22 and the first active layer AL1 of FIG. 23, the first gate insulating layer 112 may be disposed between the first active layer AL1 of FIG. 23 and the first gate layer GL1 of FIG. 24, the second gate insulating layer 113 may be disposed between the first gate layer GL1 of FIG. 24 and the second gate layer GL2 of FIG. 25, the third gate insulating layer 114 may be disposed between the second gate layer GL2 of FIG. 25 and the second active layer AL2 of FIG. 26, the fourth gate insulating layer 115 may be disposed between the second active layer AL2 of FIG. 26 and the third gate layer GL3 of FIG. 27, and the interlayer insulating layer 117 may be disposed between the third gate layer GL3 of FIG. 27 and the source-drain layer SDL of FIG. 28. These layers may include silicon oxide, silicon nitride, silicon oxynitride, aluminum oxide, titanium oxide, tantalum oxide, hafnium oxide, and/or zinc oxide. The insulating layers may each have a single layer or a multi-layer when implemented. Elements of different layers may be electrically connected to each other through contact holes defined in the insulating layers.

Content described in the embodiment with reference to FIGS. 5 to 11 is applicable to layers disposed between layers illustrated in FIGS. 22 to 28, and thus, descriptions thereof are omitted for convenience of description. Content described in the embodiment with reference to FIGS. 5 to 11 is applicable to a method of forming the layers illustrated in FIGS. 22 to 28 or a material of the layers, and thus, common descriptions thereof are omitted for convenience of description.

Figure 22:
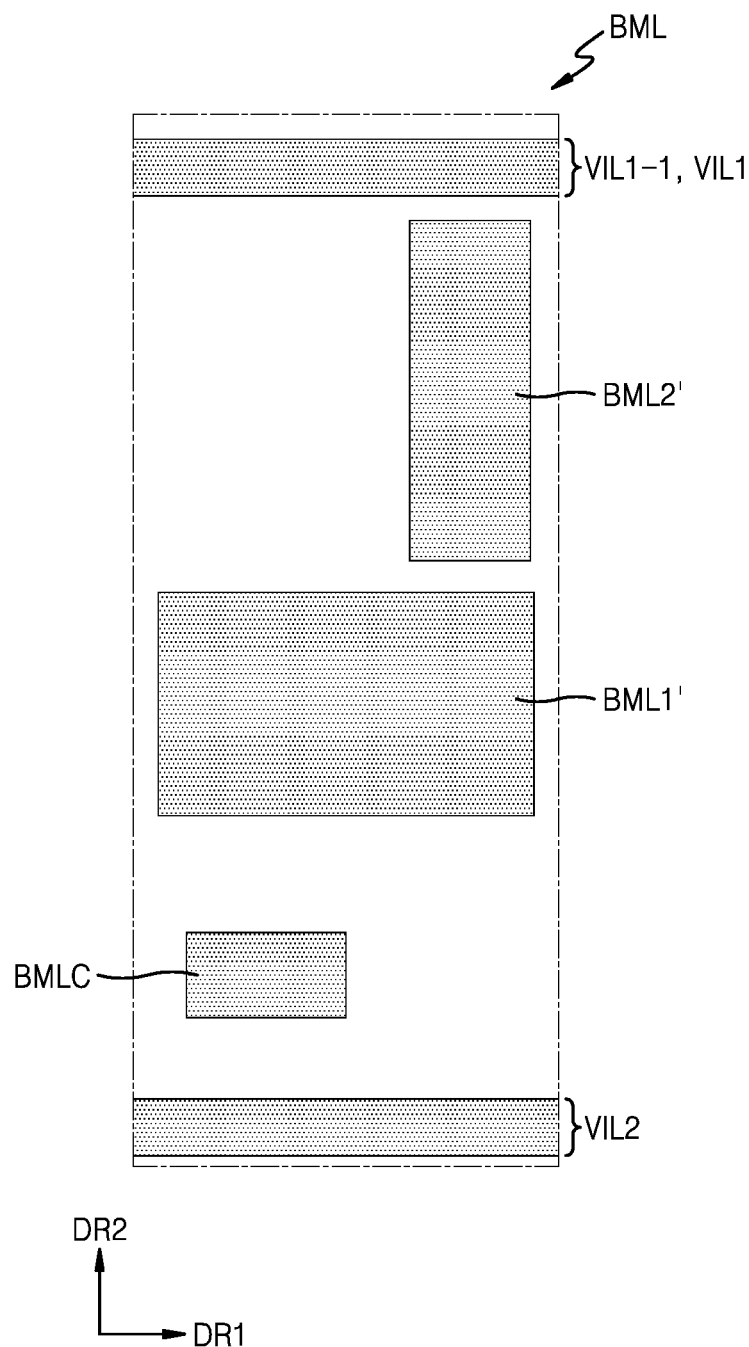
FIGS. 22, 23, 24, 25, 26, 27, and 28 are layout views of elements such as the transistors and the capacitors of FIG. 21 for each layer.

The bottom metal layer BML illustrated in FIG. 22 may include metal such as silver, copper, or aluminum. The bottom metal layer BML may protect at least a portion of the first active layer AL1 and/or at least a portion of the second active layer AL2 described below. In addition, the bottom metal layer BML may serve as a wiring electrically connecting various elements of the display apparatus to each other. It is illustrated in FIG. 22 that the bottom metal layer BML includes a 1-1$^{st}$ initialization voltage line VIL1-1 and the second initialization voltage line VIL2 extending in the first direction DR1. In addition, the bottom metal layer BML may include a connection electrode BMLC, a first bottom metal layer BML1', and a second bottom metal layer BML2', the connection electrode BMLC having shapes patterned to be apart from each other.

Figure 23:
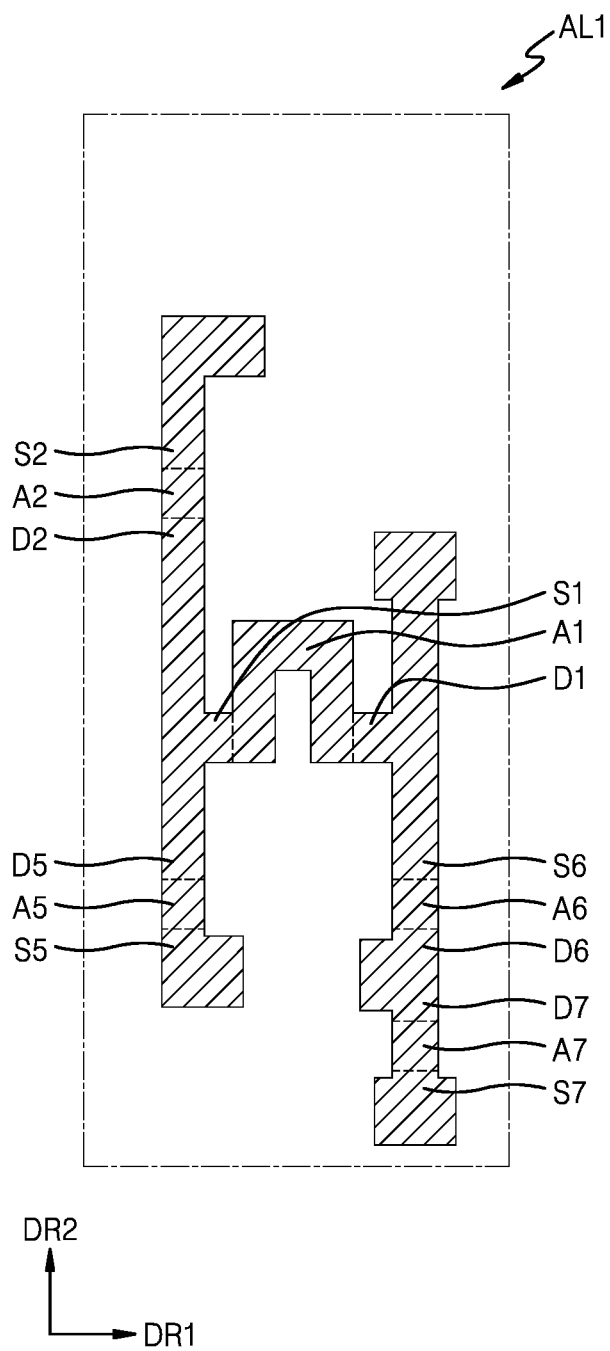

The first active layer AL1 illustrated in FIG. 23 may be a semiconductor layer including polycrystalline silicon. It is illustrated in the equivalent circuit diagram of FIG. 20 that specific portions of the first active layer AL1 are doped with p-type impurities and the first transistor T1, the second transistor T2, the fifth transistor T5, the sixth transistor T6, and the seventh transistor T7 are implemented as PMOS-FET. In addition, other portions of the first active layer AL1 may be doped with impurities and may serve as a wiring electrically connecting transistors and/or capacitors to each other, or serve as a capacitor electrode, etc.

The second active layer AL2 of FIG. 26 may be a semiconductor layer including an oxide. The second active layer AL2 according to an embodiment is different from the second active layer AL2 in the embodiment described with reference to FIG. 9 in that only the third transistor T3 and the fourth transistor T4 include the second active layer AL2.

Figure 24:
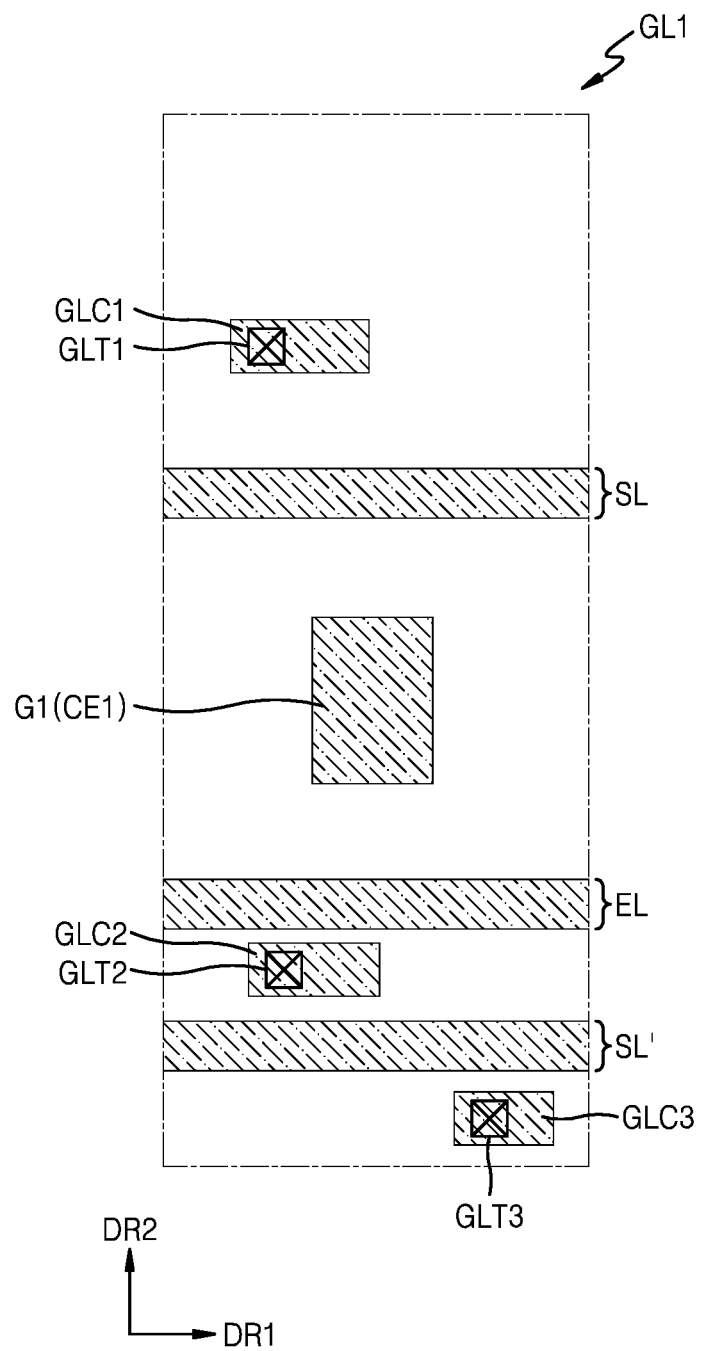
Figure 25:
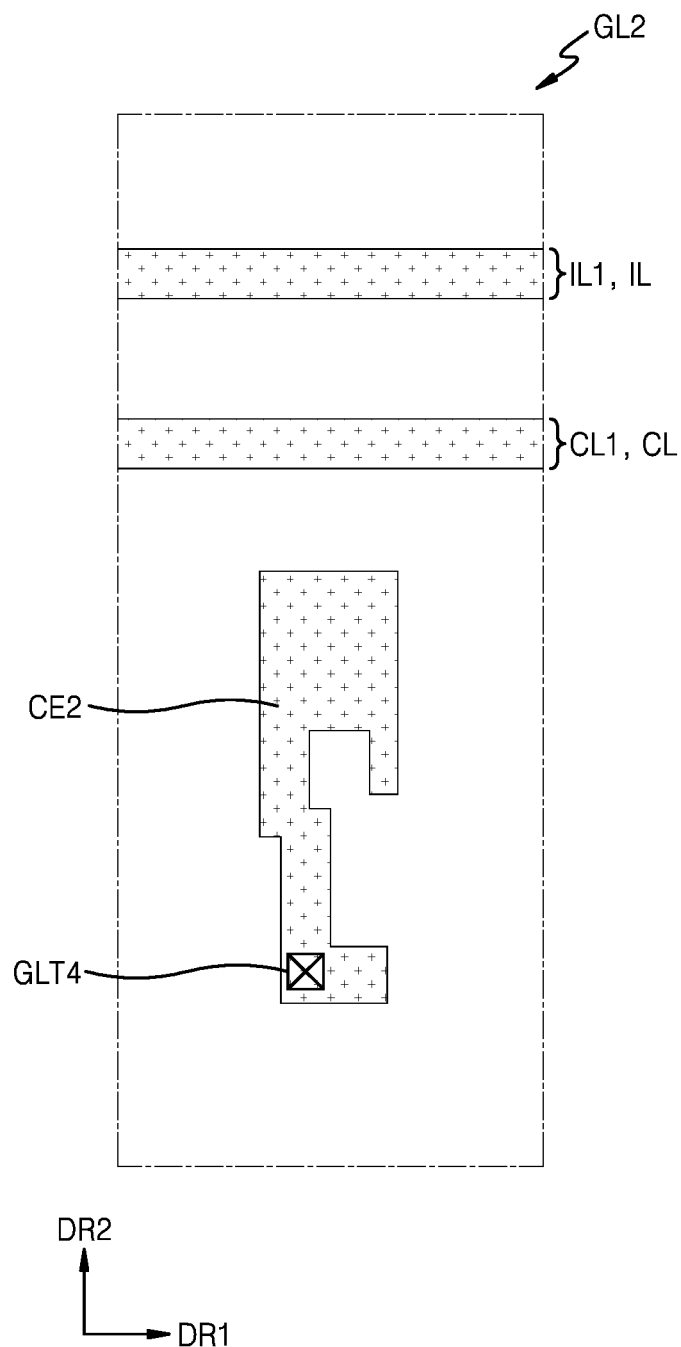

A material of the first gate layer GL1 to the third gate layer GL3 illustrated in FIGS. 24, 25, and 27 is the same as that described with reference to FIGS. 7, 8, and 10.

The first gate layer GL1 illustrated in FIG. 24 may include the scan line SL, the emission control line EL, and the previous scan line SL' each extending in the first direction DR1, and include connection electrodes GLC1, GLC2, and GLC3 apart from each other and the first gate electrode G1. The first gate electrode G1 may be one body with the first capacitor electrode CE1.

The second gate layer GL2 illustrated in FIG. 25 includes the first initialization line IL1 and the first compensation control line CL1 each extending in the first direction DR1. In addition, the second gate layer GL2 may include the second capacitor electrode CE2 disposed over the first capacitor electrode CE1 and constituting the storage capacitor Cst in cooperation with the first capacitor electrode CE1.

As illustrated in FIG. 27, the third gate layer GL3 includes a $1\text{-}2^{nd}$ initialization voltage line VIL1-2, the second initialization line IL2, and the second compensation control line CL2 each extending in the first direction DR1. The $1\text{-}2^{nd}$ initialization voltage line VIL1-2 constitutes the first initialization voltage line VIL1 in cooperation with the $1\text{-}1^{st}$ initialization voltage line VIL1-1. The second initialization line IL2 constitutes the initialization line IL in cooperation with the first initialization line IL1. In addition, the second compensation control line CL2 constitutes the compensation control line CL in cooperation with the first compensation control line CL1. The third gate layer GL3 may include the connection electrode GLC4.

For reference, a contact hole GLT1 illustrated in FIG. 24 is defined in the first gate insulating layer 112 to electrically connect the connection electrode GLC1 illustrated in FIG. 24 to the second source region S2 of the first active layer AL1 of FIG. 23 disposed therebelow. A contact hole GLT2 illustrated in FIG. 24 is defined in the first gate insulating layer 112 to electrically connect the connection electrode GLC2 illustrated in FIG. 24 to the fifth source region S5 of the first active layer AL1 of FIG. 23 disposed therebelow. In addition, a contact hole GLT3 illustrated in FIG. 24 is defined in the first gate insulating layer 112 to electrically connect the connection electrode GLC3 illustrated in FIG. 24 to the seventh source region S7 of the first active layer AL1 of FIG. 23 disposed therebelow.

A contact hole GLT4 illustrated in FIG. 25 is defined in the second gate insulating layer 113 to electrically connect the second capacitor electrode CE2 illustrated in FIG. 25 to the connection electrode GLC2 of FIG. 24 disposed therebelow. Accordingly, the second capacitor electrode CE2 illustrated in FIG. 25 is electrically connected to the fifth source region S5 illustrated in FIG. 23 through the connection electrode GLC2 of FIG. 24.

A contact hole ALT1 illustrated in FIG. 26 is defined in the first gate insulating layer 112, the second gate insulating layer 113, and the third gate insulating layer 114 to electrically connect the third drain region D3 of the second active layer AL2 illustrated in FIG. 26 to the first drain region D1 of the first active layer AL1 illustrated in FIG. 23. In addition, a contact hole ALT2 illustrated in FIG. 26 is defined in the second buffer layer 111b, the second gate insulating layer 113, and the third gate insulating layer 114 to electrically connect the fourth source region S4 of the second active layer AL2 illustrated in FIG. 26 to the $1\text{-}1^{st}$ initialization voltage line VIL1-1 of the bottom metal layer BML illustrated in FIG. 22.

A contact hole GLT5 illustrated in FIG. 27 is defined in the fourth gate insulating layer 115 to electrically connect the $1\text{-}2^{nd}$ initialization voltage line VIL1-2 illustrated in FIG. 27 to the fourth source region S4 of the second active layer AL2 of FIG. 26 disposed therebelow. In addition, a contact hole GLT6 illustrated in FIG. 27 is defined in the fourth gate insulating layer 115 to electrically connect the connection electrode GLC4 illustrated in FIG. 27 to the fourth drain region D4 or the third source region S3 of the second active layer AL2 of FIG. 26 disposed therebelow.

The source-drain layer SDL of FIG. 28 includes the data line DL and the power voltage line PL extending in an approximately second direction DR2. The second direction DR2 may be a direction crossing the first direction DR1. The source-drain layer SDL may include connection electrodes SDC1 and SDC2.

The data line DL illustrated in FIG. 28 is electrically connected to the connection electrode GLC1 of the first gate layer GL1 through a contact hole SDLT1 defined in the second gate insulating layer 113, the third gate insulating layer 114, the fourth gate insulating layer 115, and/or the interlayer insulating layer 117, and consequently, electrically connected to the second source region S2 of the first active layer AL1 through the connection electrode GLC1. One end of the power voltage line PL illustrated in FIG. 28 is electrically connected to the second capacitor electrode CE2 of the second gate layer GL2 through a contact hole SDLT2 defined in the third gate insulating layer 114, the fourth gate insulating layer 115, and/or the interlayer insulating layer 117. Another end of the power voltage line PL illustrated in FIG. 28 is electrically connected to the second capacitor electrode CE2 of the second gate layer GL2 through a contact hole SDLT3 defined in the third gate insulating layer 114, the fourth gate insulating layer 115, and/or the interlayer insulating layer 117. Accordingly, though it is illustrated in FIG. 28 that the power voltage line PL is disconnected in the middle, the power voltage line PL may be electrically connected over a plurality of pixels arranged in the second direction DR2 through the second capacitor electrode CE2.

One end of the connection electrode SDC1 illustrated in FIG. 28 is connected to a connection electrode GLC4 of the third gate layer GL3 through a contact hole SDLT4 defined in the interlayer insulating layer 117, and thus, may be electrically connected to the third source region S3 or the fourth drain region D4 of the second active layer AL2. Another end of the connection electrode SDC1 may be electrically connected to the first capacitor electrode CE1 of the first gate layer GL1 through a contact hole SDLT5 defined in the second gate insulating layer 113, the third gate insulating layer 114, the fourth gate insulating layer 115, and/or the interlayer insulating layer 117. That is, the connection electrode SDC1 may electrically connect the third source region S3 or the fourth drain region D4 of the second active layer AL2 to the first capacitor electrode CE1.

The connection electrode SDC2 illustrated in FIG. 28 is electrically connected to the sixth drain region D6 and the seventh drain region D7 of the first active layer AL1 through a contact hole SDLT6 defined in the first gate insulating layer 112, the second gate insulating layer 113, the third gate insulating layer 114, the fourth gate insulating layer 115, and/or the interlayer insulating layer 117. Though a contact hole SDLT7 is illustrated in FIG. 28 for convenience of description, the contact hole SDLT7 is not a contact hole connecting the connection electrode SDC2 to a layer disposed therebelow. The contact hole SDLT7 is defined in the planarization layer 118 covering the source-drain layer SDL illustrated in FIG. 28 to electrically connect the pixel electrode 310 of the organic light-emitting diode OLED disposed on the planarization layer 118 to the connection electrode SDC2.

When various wirings overlap the active layer, a portion of the wirings that overlaps the active layer may serve as a gate electrode. As an example, a portion of the scan line SL of the first gate layer GL1 that overlaps the first active layer AL1 may be disposed over the second active region A2 to serve as the second gate electrode. Likewise, portions of the emission control line EL of the first gate layer GL1 that overlap the first active layer AL1 may be disposed over the fifth active region A5 and the sixth active region A6 to serve as the fifth gate electrode and the sixth gate electrode, and a portion of the previous scan line SL' of the first gate layer GL1 that overlaps the first active layer AL1 may be disposed over the seventh active region A7 to serve as the seventh gate electrode.

Portions of the first initialization line IL1 of the second gate layer GL2 and the second initialization line IL2 of the third gate layer GL3 that overlap the second active layer AL2 may be respectively disposed over and below the fourth active region A4 to serve as a fourth gate electrode. In this case, the fourth gate electrode may be understood to have a double gate structure. Portions of the first compensation control line CL1 of the second gate layer GL2 and the second compensation control line CL2 of the third gate layer GL3 that overlap the second active layer AL2 may be respectively disposed above and below the third active region A3 to serve as the third gate electrode. In this case, the third gate electrode may be understood to have a double gate structure.

The first transistor T1, the second transistor T2, the fifth transistor T5, the sixth transistor T6, and the seventh transistor T7 may be thin-film transistors including a silicon semiconductor. The third transistor T3 and the fourth transistor T4 may be thin-film transistors including an oxide semiconductor.

Semiconductor layers of the first transistor T1, the second transistor T2, the fifth transistor T5, the sixth transistor T6, and the seventh transistor T7 are disposed on the same layer as illustrated in FIG. 23 and include the same material. FIG. 23 illustrates that the semiconductor layers of the first transistor T1, the second transistor T2, the fifth transistor T5, the sixth transistor T6, and the seventh transistor T7 are integrally formed as a single body. The semiconductor layers of the first transistor T1, the second transistor T2, the fifth transistor T5, the sixth transistor T6, and the seventh transistor T7 may be connected to each other and bent in various shapes as illustrated in FIG. 23.

As described above, the second active layer AL2 may include an oxide semiconductor. In addition, as illustrated in FIG. 26, the third transistor T3 and the fourth transistor T4 may include portions of the second active layer AL2 as elements as illustrated in FIG. 26. Semiconductor layers of the third transistor T3 and the fourth transistor T4 may be connected to each other as illustrated in FIG. 26.

The pixel-defining layer 119 may be disposed on the planarization layer 118. The organic light-emitting diode OLED may be disposed on the planarization layer 118. Detailed descriptions thereof are described above and thus omitted.

In the display apparatus according to an embodiment, the bottom metal layer BML is provided to protect the first active layer AL1 and the second active layer AL2 including an oxide semiconductor from external light, etc. Accordingly, the display apparatus displaying a high-quality image may be implemented. It is illustrated in FIG. 22 that the bottom metal layer BML includes the first bottom metal layer BML1' and the second bottom metal layer BML2', the first bottom metal layer BML1' corresponding to the first active region A1, and the second bottom metal layer BML2' corresponding to the third active region A3 and the fourth active region A4.

In addition, the bottom metal layer BML may include the 1-$1^{st}$ initialization voltage line VIL1-1 and the second initialization voltage line VIL2, and various elements of the display apparatus are electrically connected to each other through the connection electrode BMLC when implemented. Accordingly, a layer structure in the display apparatus having a multi-layered structure may be simplified.

Figure 30:
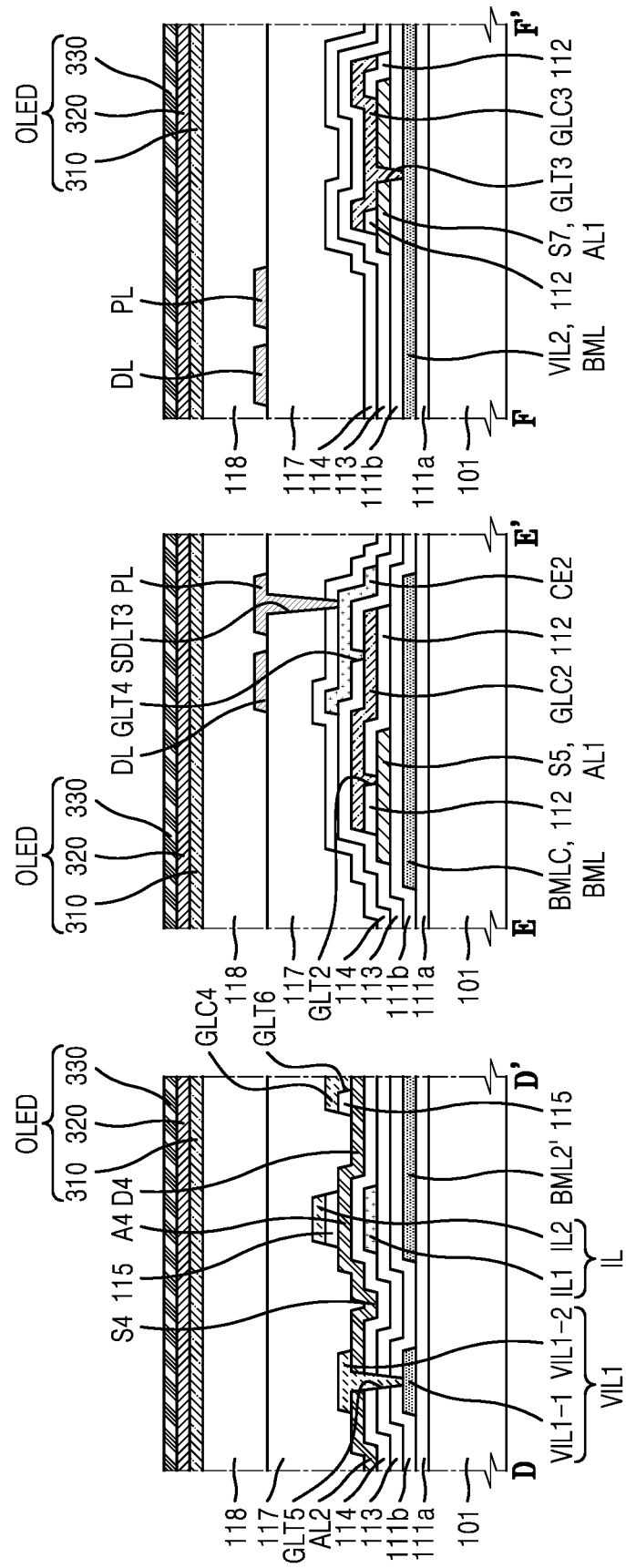
FIG. 30 is a cross-sectional view illustrating a portion of a display apparatus according to an embodiment.

FIG. 30 is a cross-sectional view illustrating a portion of a display apparatus according to another embodiment. The display apparatus according to an embodiment is different from the display apparatus according to the embodiment described with reference to FIG. 29 in that The 1-$2^{nd}$ initialization voltage line VIL1-2 in the third gate layer GL3 is connected to not only the fourth source region S4 of the second active layer AL2, but also the contact hole GLT5 is defined in the second buffer layer 111$b$, the second gate insulating layer 113, and the third gate insulating layer 114, and thus, the 1-$2^{nd}$ initialization voltage line VIL1-2 is directly connected to the 1-$1^{st}$ initialization voltage line VIL1-1 of the bottom metal layer BML. Various modifications are possible.

To this point, though description is made to the organic light-emitting display apparatus, the embodiment is not limited thereto and any display apparatus including pixels having the above-described structure falls within the scope of the present disclosure.

According to an embodiment, a high-resolution display apparatus that may display a high-quality image may be implemented. However, the scope of the present disclosure is not limited by this effect.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   an organic light-emitting diode;
   a driving transistor configured to control an amount of current flowing from a second node to the organic light-emitting diode according to a voltage applied to a first node, the second node being electrically connected to a power voltage line;
   a first bottom metal layer disposed below the driving transistor and electrically connected to the driving transistor; and
   a first initialization transistor connected between the first node and a first initialization voltage line,
   wherein the first bottom metal layer electrically connects the driving transistor to the first initialization transistor, and
   wherein, when viewed from a direction perpendicular to the first bottom metal layer, the first bottom metal layer overlaps the first initialization semiconductor layer.

2. The display apparatus of claim 1, wherein a driving semiconductor layer of the driving transistor and a first initialization semiconductor layer of the first initialization transistor are disposed on different layers.

3. The display apparatus of claim 2, wherein the first initialization semiconductor layer is disposed over an insulating layer covering a driving gate electrode of the driving transistor.

4. The display apparatus of claim 3, further comprising:
a connection electrode disposed over the first initialization semiconductor layer and connecting the first initialization semiconductor layer to the first bottom metal layer through contact holes.

5. The display apparatus of claim 2, wherein the driving semiconductor layer includes a silicon semiconductor, and the first initialization semiconductor layer includes an oxide semiconductor.

6. The display apparatus of claim 1, wherein a driving gate electrode of the driving transistor is electrically connected to the first bottom metal layer.

7. The display apparatus of claim 6, wherein the driving gate electrode is disposed over a driving semiconductor layer of the driving transistor, and connected to the first bottom metal layer through a contact hole defined in an insulating layer between the driving semiconductor layer and the driving gate electrode and in an insulating layer between the first bottom metal layer and the driving semiconductor layer.

8. The display apparatus of claim 7, wherein the driving semiconductor layer is bent to surround a portion of the contact hole.

9. A display apparatus comprising:
an organic light-emitting diode;
a driving transistor configured to control an amount of current flowing from a second node to the organic light-emitting diode according to a voltage applied to a first node, the second node being electrically connected to a power voltage line;
a first bottom metal layer disposed below the driving transistor and electrically connected to the driving transistor;
an emission control transistor connected between the driving transistor and the organic light-emitting diode and turned on when an emission control signal is supplied through an emission control line;
a second initialization transistor connected between the emission control transistor and a second initialization voltage line; and
a second bottom metal layer disposed below the emission control transistor and the second initialization transistor and electrically connecting the emission control transistor to the second initialization transistor.

10. The display apparatus of claim 9, wherein an emission control semiconductor layer of the emission control transistor and a second initialization semiconductor layer of the second initialization transistor are disposed on different layers.

11. The display apparatus of claim 10, wherein the second initialization semiconductor layer is disposed over an insulating layer covering an emission control gate electrode of the emission control transistor.

12. The display apparatus of claim 11, further comprising:
a first connection electrode disposed over the second initialization semiconductor layer and electronically connecting the second initialization semiconductor layer to the second bottom metal layer through contact holes; and
a second connection electrode disposed on a same layer as the first connection electrode and connecting the emission control semiconductor layer to the second bottom metal layer through contact holes.

13. The display apparatus of claim 10, wherein the emission control semiconductor layer includes a silicon semiconductor, and the second initialization semiconductor layer includes an oxide semiconductor.

14. The display apparatus of claim 9, wherein the second bottom metal layer is disposed on a same layer as the first bottom metal layer.

15. A display apparatus comprising:
an organic light-emitting diode;
a driving transistor configured to control an amount of current flowing from a second node to the organic light-emitting diode according to a voltage applied to a first node, the second node being electrically connected to a power voltage line;
a first bottom metal layer disposed below the driving transistor and electrically connected to the driving transistor;
a storage capacitor connected between the first node and the power voltage line and including a first capacitor electrode and a second capacitor electrode, the first capacitor electrode being integrally formed as a single body with a driving gate electrode of the driving transistor, and the second capacitor electrode being disposed over the first capacitor electrode;
an operation control transistor connected between the driving transistor and the power voltage line and turned on when an emission control signal is supplied through an emission control line; and
a third bottom metal layer disposed below the operation control transistor and electrically connecting the operation control transistor to the second capacitor electrode.

16. The display apparatus of claim 15, further comprising:
a connection electrode disposed on a same layer as the second capacitor electrode and connecting an operation control semiconductor layer of the operation control transistor to the third bottom metal layer,
wherein the second capacitor electrode is electrically connected to the third bottom metal layer.

17. A display apparatus comprising:
a substrate;
a first active layer including a driving semiconductor layer disposed over the substrate;
a first gate layer including a driving gate electrode disposed over the driving semiconductor layer, and a first source electrode or a first drain electrode contacting the first active layer;
an organic light-emitting diode in which brightness thereof is controlled by a current flowing through the driving semiconductor layer according to a voltage applied to the driving gate electrode; and
a bottom metal layer disposed below the first active layer and including a first bottom metal layer connected to the driving gate electrode,
wherein the first source electrode or the first drain electrode contacts a first wiring of the bottom metal layer.

18. The display apparatus of claim 17, wherein the driving gate electrode is connected to the first bottom metal layer through a contact hole defined in an insulating layer between the first active layer and the first gate layer and in an insulating layer between the first bottom metal layer and the first active layer.

19. The display apparatus of claim 18, wherein the driving semiconductor layer is bent to surround a portion of the contact hole.

20. A display apparatus comprising:
a substrate;

a first active layer including a driving semiconductor layer disposed over the substrate;

a first gate layer including a driving gate electrode disposed over the driving semiconductor layer;

an organic light-emitting diode in which brightness thereof is controlled by a current flowing through the driving semiconductor layer according to a voltage applied to the driving gate electrode;

a bottom metal layer disposed below the first active layer and including a first bottom metal layer connected to the driving gate electrode;

a second active layer disposed over the first gate layer and including a first initialization semiconductor layer;

a second gate layer disposed between the first gate layer and the second active layer and including a bottom initialization line having a portion that overlaps the first initialization semiconductor layer; and a third gate layer disposed over the second active layer and including a top initialization line having a portion that overlaps the first initialization semiconductor layer, wherein the first bottom metal layer electrically connects the driving gate electrode to the first initialization semiconductor layer.

21. The display apparatus of claim 20, further comprising:

a source-drain layer disposed over the third gate layer and including a connection electrode connecting the first initialization semiconductor layer to the first bottom metal layer through contact holes.

22. The display apparatus of claim 20, wherein, when viewed from a direction perpendicular to the substrate, the first bottom metal layer overlaps the first initialization semiconductor layer.

23. The display apparatus of claim 20, wherein the first active layer includes a silicon semiconductor, and the second active layer includes an oxide semiconductor.

24. The display apparatus of claim 20, wherein the first active layer further includes an emission control semiconductor layer, the second active layer further includes a second initialization semiconductor layer, and the bottom metal layer further includes a second bottom metal layer electrically connecting the emission control semiconductor layer to the second initialization semiconductor layer.

25. The display apparatus of claim 24, wherein the third gate layer further includes a first connection electrode and a second connection electrode, the first connection electrode connecting the second initialization semiconductor layer to the second bottom metal layer through contact holes, and the second connection electrode connecting the emission control semiconductor layer to the second bottom metal layer through contact holes.

26. The display apparatus of claim 20, wherein the third gate layer further includes a second source electrode or a second drain electrode contacting the second active layer.

27. The display apparatus of claim 26, wherein the second source electrode or the second drain electrode contacts a second wiring of the bottom metal layer.

28. The display apparatus of claim 20, wherein the third gate layer further includes a first source electrode or a first drain electrode contacting the first active layer, and a second source electrode or a second drain electrode contacting the second active layer.

29. The display apparatus of claim 28, wherein the first source electrode or the first drain electrode contacts a first wiring of the bottom metal layer, and the second source electrode or the second drain electrode contacts a second wiring of the bottom metal layer.

30. A display apparatus comprising:

a substrate;

a first active layer including a driving semiconductor layer disposed over the substrate;

a first gate layer including a driving gate electrode disposed over the driving semiconductor layer;

an organic light-emitting diode in which brightness thereof is controlled by a current flowing through the driving semiconductor layer according to a voltage applied to the driving gate electrode;

a bottom metal layer disposed below the first active layer and including a first bottom metal layer connected to the driving gate electrode; and a second gate layer disposed over the first gate layer and including a second capacitor electrode that at least partially overlaps the driving gate electrode, wherein the first active layer further includes an operation control semiconductor layer, wherein the first gate layer further includes a bottom emission control line that overlaps the operation control semiconductor layer, and wherein the bottom metal layer further includes a third bottom metal layer electrically connecting the operation control semiconductor layer to the second capacitor electrode.

31. The display apparatus of claim 30, wherein the second gate layer further includes a connection electrode connecting the operation control semiconductor layer to the third bottom metal layer, and the second capacitor electrode is connected to the third bottom metal layer.

* * * * *